United States Patent
Kaspi et al.

(10) Patent No.: US 11,031,753 B1
(45) Date of Patent: Jun. 8, 2021

(54) EXTRACTING THE FUNDAMENTAL MODE IN BROAD AREA QUANTUM CASCADE LASERS

(71) Applicant: Government of the United States, as represented by the Secretary of the Air Force, Kirtland AFB, NM (US)

(72) Inventors: Ron Kaspi, Albuquerque, NM (US); Sanh Luong, Albuquerque, NM (US)

(73) Assignee: The Government of the United States of America as represented by the Secretary of the Air Force, Kirtland AFB, NM (US)

( * ) Notice: Subject to any disclaimer, the term of this patent is extended or adjusted under 35 U.S.C. 154(b) by 0 days.

(21) Appl. No.: 15/881,595

(22) Filed: Jan. 26, 2018

Related U.S. Application Data

(60) Provisional application No. 62/585,335, filed on Nov. 13, 2017.

(51) Int. Cl.
*H01S 5/20* (2006.01)
*H01S 5/34* (2006.01)
*H01S 5/065* (2006.01)

(52) U.S. Cl.
CPC .......... *H01S 5/2027* (2013.01); *H01S 5/0655* (2013.01); *H01S 5/2036* (2013.01); *H01S 5/3402* (2013.01)

(58) Field of Classification Search
CPC .... H01S 5/2022; H01S 5/2027; H01S 5/3402; H01S 5/3401; H01S 5/2036; H01S 5/2018–2031; H01S 5/0655; H01S 5/2218–222; H01S 5/22–2277
See application file for complete search history.

(56) References Cited

U.S. PATENT DOCUMENTS

| | | | |
|---|---|---|---|
| 4,270,096 A | 5/1981 | Hayashi et al. | |
| 4,315,226 A * | 2/1982 | Chinone | H01S 5/20 372/45.01 |
| 4,349,905 A | 9/1982 | Ackley | |
| 4,369,513 A | 1/1983 | Umeda et al. | |

(Continued)

FOREIGN PATENT DOCUMENTS

| | | |
|---|---|---|
| CN | 1983750 | 6/2007 |
| CN | 102570307 | 7/2012 |

(Continued)

OTHER PUBLICATIONS

Kaspi et al., Extracting fundamental transverse mode operation in broad area quantum cascade lasers, Applied Physics Letters 109, 211102 (2016); doi: 10.1063/1.4968800.

(Continued)

*Primary Examiner* — Joshua King
(74) *Attorney, Agent, or Firm* — AFNWC; David L. Narciso

(57) ABSTRACT

A broad area quantum cascade laser includes an optical cavity disposed between two sidewalls, the optical cavity including an active region for producing photons when a current is applied thereto, where the optical cavity is subject to a presence of at least one high order transverse optical mode due to its broad area geometry. The broad area quantum cascade laser may also include an optically lossy material disposed on at least a first portion of one or more of the two sidewalls.

19 Claims, 14 Drawing Sheets

(56) References Cited

U.S. PATENT DOCUMENTS

| | | | |
|---|---|---|---|
| 4,506,366 | A | 3/1985 | Chinone et al. |
| 4,622,674 | A | 11/1986 | Mito |
| 4,757,510 | A | 7/1988 | Kaneno et al. |
| 4,791,649 | A * | 12/1988 | Yamamoto ............... H01S 5/16 372/45.01 |
| 4,868,838 | A | 9/1989 | Yamamoto |
| 4,897,846 | A | 1/1990 | Yoshida et al. |
| 4,961,197 | A | 10/1990 | Tanaka et al. |
| 5,084,892 | A * | 1/1992 | Hayakawa ............... H01S 5/10 372/45.01 |
| 5,089,437 | A | 2/1992 | Shima et al. |
| 5,336,635 | A | 8/1994 | Anayama et al. |
| 5,546,418 | A | 8/1996 | Ishibashi et al. |
| 5,559,819 | A | 9/1996 | Abe et al. |
| 5,608,750 | A | 3/1997 | Nakatsuka et al. |
| 5,623,509 | A | 4/1997 | Iwano et al. |
| 6,256,330 | B1 | 7/2001 | LaComb |
| 6,351,479 | B1 | 2/2002 | Mori et al. |
| 6,421,363 | B1 * | 7/2002 | Osinski ............... H01S 5/1032 359/344 |
| 6,516,016 | B1 | 2/2003 | Fukunaga et al. |
| 6,563,852 | B1 * | 5/2003 | Baillargeon ........... B82Y 20/00 372/18 |
| 6,620,641 | B2 | 9/2003 | Yamaguchi et al. |
| 6,862,300 | B1 * | 3/2005 | Traut ................... H01S 5/22 372/19 |
| 7,061,022 | B1 * | 6/2006 | Pham ................... B82Y 20/00 257/623 |
| 7,271,019 | B1 * | 9/2007 | Pham ................... B82Y 20/00 257/E21.366 |
| 7,296,897 | B2 | 11/2007 | Mooradian et al. |
| 7,369,593 | B2 | 5/2008 | Makita et al. |
| 7,426,223 | B2 | 9/2008 | Mizuuchi |
| 7,463,664 | B2 | 12/2008 | Mizuuchi et al. |
| 7,715,457 | B2 | 5/2010 | Schmidt et al. |
| 8,259,767 | B2 | 9/2012 | Botez et al. |
| 8,428,093 | B2 | 4/2013 | Botez et al. |
| 2002/0191658 | A1 * | 12/2002 | Capasso ............... B82Y 20/00 372/45.013 |
| 2003/0219053 | A1 * | 11/2003 | Swint .................. H01S 5/10 372/46.01 |
| 2005/0117618 | A1 * | 6/2005 | Tredicucci ............ B82Y 20/00 372/45.01 |
| 2005/0201438 | A1 * | 9/2005 | Traut .................. H01S 5/22 372/43.01 |
| 2006/0093003 | A1 | 5/2006 | Moon et al. |
| 2007/0030870 | A1 | 2/2007 | Bour et al. |
| 2010/0164636 | A1 * | 7/2010 | Sekiguchi ........... B82Y 20/00 331/107 T |
| 2011/0058584 | A1 * | 3/2011 | Ohno .................. B82Y 20/00 372/45.01 |
| 2013/0329761 | A1 * | 12/2013 | Hashimoto ........... H01S 5/2219 372/45.012 |
| 2015/0318669 | A1 * | 11/2015 | Koeth ................. H01S 5/2018 372/45.01 |

FOREIGN PATENT DOCUMENTS

| | | | |
|---|---|---|---|
| WO | WO9833249 | 7/1998 | |
| WO | WO2007132425 | 11/2007 | |
| WO | WO-2009070821 A2 * | 6/2009 | ............ B82Y 20/00 |

OTHER PUBLICATIONS

Bai et al., Room temperature quantum cascade lasers with 27% wall plug efficiency, Appl. Phys. Lett. 98, 181102 (2011); doi: 10.1063/1.3586773.

Bewley et al., Beam Steering in High-Power CW Quantum-Cascade Lasers, IEEE Journal of Quantum Electronics, vol. 41, No. 6, Jun. 2005.

Bouzi et al., Suppression of pointing instability in quantum cascade lasers by transverse mode control, Appl. Phys. Lett. 102, 122105 (2013); doi: 10.1063/1.4798656.

Yu et al., Coherent Coupling of Multiple Transverse Modes in Quantum Cascade Lasers, PRL 102, 013901, Jan. 5, 2009 DOI: 10.1103/PhysRevLett.102.013901.

Allen et al., Direct measurement of the linewidth enhancement factor by optical heterodyning of an amplitude-modulated quantum cascade laser, Applied Physics Letters 89, 091121, Aug. 31, 2006 DOI: 10.1063/1.2345035.

Fan et al., Wide-ridge metal-metal terahertz quantum cascade lasers with high-order lateral mode suppression, Applied Physics Letters 92, 031106, Jan. 23, 2008 DOI: 10.1063/1.2835202.

Sergachev et al., Gain-guided broad area quantum cascade lasers emitting 23.5 W peak power at room temperature, vol. 24, No. 17, Aug. 22, 2016, Optics Express 19063.

Gokden et al., Broad area photonic crystal distributed feedback quantum cascade lasers emitting 34 W at . . . , Applied Physics Letters 97, 131112, Oct. 1, 2010 doi:10.1063/1.3496043.

Heydari et al., High brightness angled cavity quantum cascade lasers, Appl. Phys. Lett. 106, 091105 (2015); doi: 10.1063/1.4914477.

Bai et al., High power broad area quantum cascade lasers, Applied Physics Letters 95, 221104 (2009); doi: 10.1063/1.3270043.

Zhao et al., Improved performance of quantum cascade laser with porous waveguide structure, Journal of Applied Physics 112, 013111 (2012); doi: 10.1063/1.4733696.

Jumpertz et al., Experimental Investigation of the Above-Threshold Linewidth Broadening Factor of a Mid-Infrared Quantum Cascade Laser, 2015 IEEE Photonics Conference (IPC), Reston, VA, 2015, pp. 561-562. doi: 10.1109/IPCon.2015.7323555.

Lyakh et al., 5.6 um quantum cascade lasers based on a two-material active region composition with a room temperature wall-plug efficiency exceeding 28%, Appl. Phys. Lett. 109, 121109 (2016); doi: 10.1063/1.4963233.

Nolde et al., Broad-Area Quantum Cascade Lasers with Pulsed Output Power up to 53 W, 2009 Conference on Lasers and Electro-Optics and 2009 Conference on Quantum electronics and Laser Science Conference, Baltimore, MD, 2009, pp. 1-2. doi: 10.1364/CLEO.2009.CThC6.

Bismuto et al., High performance, low dissipation quantum cascade lasers across the mid-IR range, Optics Express 5477, vol. 23, No. 5, Feb. 23, 2015 DOI:10.1364/OE.23.005477.

Razeghi et al., High power quantum cascade lasers, New Journal of Physics 11, Dec. 17, 2009 Online at http://www.njp.org/ doi:10.1088/1367-2630/11/12/125017.

\* cited by examiner

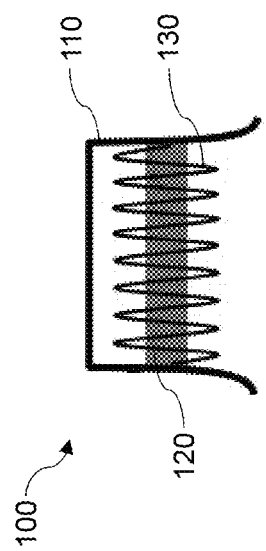
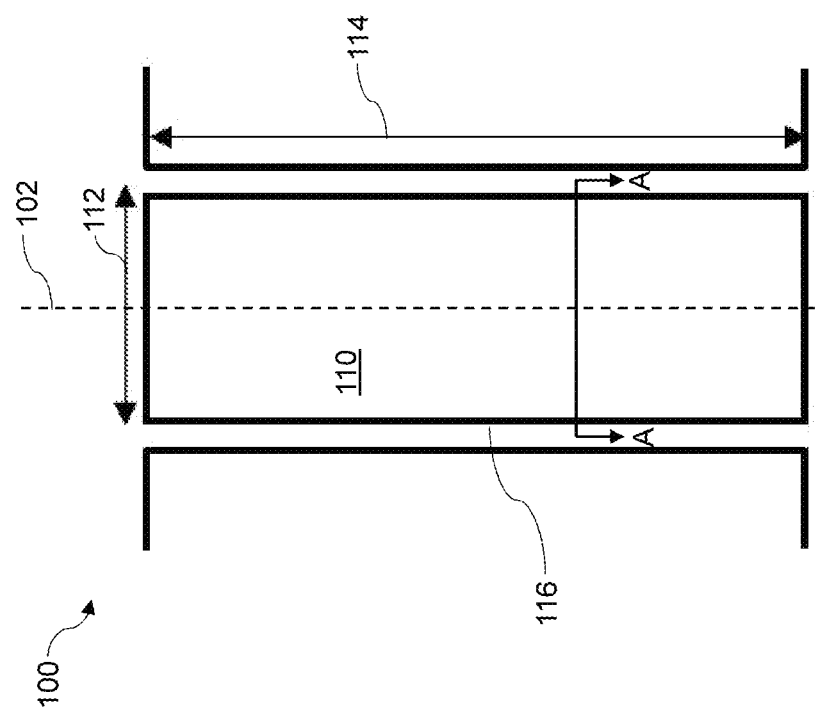
FIG. 1B (prior art)
FIG. 1A (prior art)

US 11,031,753 B1

EXTRACTING THE FUNDAMENTAL MODE IN BROAD AREA QUANTUM CASCADE LASERS

CROSS-REFERENCE TO RELATED APPLICATIONS

This application claims the benefit of U.S. Provisional Application No. 62/585,335 filed Nov. 13, 2017, the entire content of which is hereby incorporated by reference.

STATEMENT OF GOVERNMENT INTEREST

The invention described herein may be manufactured, used, and licensed by or for the Government of the United States for all governmental purposes without the payment of any royalty.

BACKGROUND

Quantum cascade lasers (QCLs) are unipolar semiconductor lasers that use optical transitions between electronic sub-bands to produce light. QCLs can be designed to emit in the mid-infrared wavelength range (e.g., 2 µm-20 µm), and more recently in the long-infrared wavelength range, e.g., the terahertz spectral range. QCL technology has generally reached a maturity level where it can provide relatively reliable operation for use in a large variety of applications. By way of example and not limitation, detectors that incorporate QCLs can be used for chemical sensing such as pollution monitoring, gas sensing, medical diagnostics (e.g., through breath analysis), the remote detection of toxic chemicals and explosives, and others. For applications requiring radiation at a single frequency, the longitudinal mode selection in QCLs may be provided, where single longitudinal mode operation of QCLs can be achieved by fabricating the QCLs as distributed feedback lasers (DFB-QCL).

In a typical DFB-QCL device, a grating has grooves etched at the top of the device that are aligned perpendicular to the optical axis of the device to produce index coupling, which selects the longitudinal mode for single frequency emission. Many embodiments of this basic idea exist to improve the selection of the single longitudinal mode in such DFB-QCL devices.

In contrast to the longitudinal mode, the transverse (or lateral) mode in QCLs is generally not selectively controlled in existing devices. Instead, a QCL device may have a sufficiently narrow width such that only the fundamental transverse mode is active. The fundamental transverse mode ensures that a single diffraction-limited beam along the optical axis of the laser is emitted, with an angular divergence determined by the wavelength of the light and the width of the device. The power level that can be generated in a QCL, as in other semiconductor lasers, may scale with the area of the device. In instances where additional power is desired, a larger area QCL device may be fabricated, where a QCL device with a cavity width larger than 12-15 micrometers is generally referred to as a broad area device (BA-QCL).

In practice, scaling of the power by enlarging the area of the QCL is typically limited to increasing the cavity length, rather than the cavity width of the QCL. This is because keeping a narrow cavity can maintain fundamental transverse mode operation, whereas increasing the cavity width may result in the operation of high-order transverse modes, as they become more favorable. For example, if an existing mid-infrared QCL is fabricated with a cavity width of about 15 micrometers, this may lead to the emergence of high-order transverse modes, resulting in mode competition, beam steering, and loss of brightness. In cavity widths of about 20 micrometers and higher, one or several high-order transverse modes may be active where each high-order transverse mode forms a periodic structure in the near-field of the QCL device, resulting in a laser beam with two distinct lobes, where each lobe deviates from the optical axis by an angle that becomes larger as the mode number increases—see, e.g., Y. Bai et al., APPLIED PHYSICS LETTERS 95, 221104 (2009), which is hereby incorporated by reference.

Several approaches have been attempted to produce single lobed emission—the result of a fundamental transverse mode—in BA-QCLs. These include the use of angled cavities, photonic crystal gratings, gain-guided devices, and the use of a porous structure above the active region of the device. However, there are some disadvantages associated with these techniques. For example, in angled cavity configuration, the facet angles and the cavity length must be precisely controlled for single lobed emission—see, e.g., D. Heydari et al., APPLIED PHYSICS LETTERS 106, 091105 (2015), which is hereby incorporated by reference. In gain-guided devices, the current spreading determines the effective width of the device, and this results in a strong variation of the beam divergence with injection current—see, e.g., I. Sergachev et al., OPTICS EXPRESS 24, 19063 (2016), which is hereby incorporated by reference. In another approach, lateral constrictions in the waveguide were placed using a focused ion beam milling technique where only the fundamental mode was allowed to propagate to produce a Gaussian shaped far-field pattern—see, e.g., Bouzi et al., APPL. PHYS. LETT. 102, 122105 (2013), which is hereby incorporated by reference. However, this approach was limited to devices with a narrow cavity width (w=10 µm), not BA-QCLs, and the trenches had to be filled with metal to provide additional losses to achieve the desired effect. Therefore, there remains a need for improved devices, systems, and methods for extracting and maintaining fundamental transverse mode operation in BA-QCLs.

SUMMARY

In an implementation, a broad area quantum cascade laser includes an optical cavity disposed between two sidewalls, the optical cavity including an active region for producing photons when a current is applied thereto, where the optical cavity is subject to a presence of at least one high order transverse optical mode due to its broad area geometry. The broad area quantum cascade laser may also include an optically lossy material disposed on at least a first portion of one or more of the two sidewalls.

In an implementation, a broad area quantum cascade laser includes an optical cavity disposed between two sidewalls, the optical cavity including an active region for producing photons when a current is applied thereto, where the optical cavity is subject to a presence of at least one high order transverse optical mode due to its broad area geometry. The broad area quantum cascade laser may also include an optically low-loss material disposed on each of the two sidewalls. The broad area quantum cascade laser may further include an optically lossy material disposed over at least a portion of the optically low-loss material such that the optically lossy material is disposed a predetermined distance from each of the two sidewalls, where the predetermined distance is selected such that the optically lossy material induces losses to at least one high order transverse optical mode present in the optical cavity due to its broad area geometry.

In an implementation, a method includes placing an optically low-loss material on each of two sidewalls that define an optical cavity including an active region for producing photons when a current is applied thereto, and placing an optically lossy material on at least a first portion of each of the two sidewalls, where the first portion is sized and shaped such that the optically lossy material induces losses to at least one high order transverse optical mode present in the optical cavity due to its broad area geometry.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. The drawings are not necessarily to scale, emphasis instead being placed upon illustrating the principles of the devices, systems, and methods described herein. In these drawings, like reference numerals may identify corresponding elements.

FIG. 1A is a top view of a representation of a broad area quantum cascade laser (BA-QCL), in accordance with the prior art.

FIG. 1B is a front view of a representation of a BA-QCL, in accordance with the prior art.

DETAILED DESCRIPTION

Figure 2:
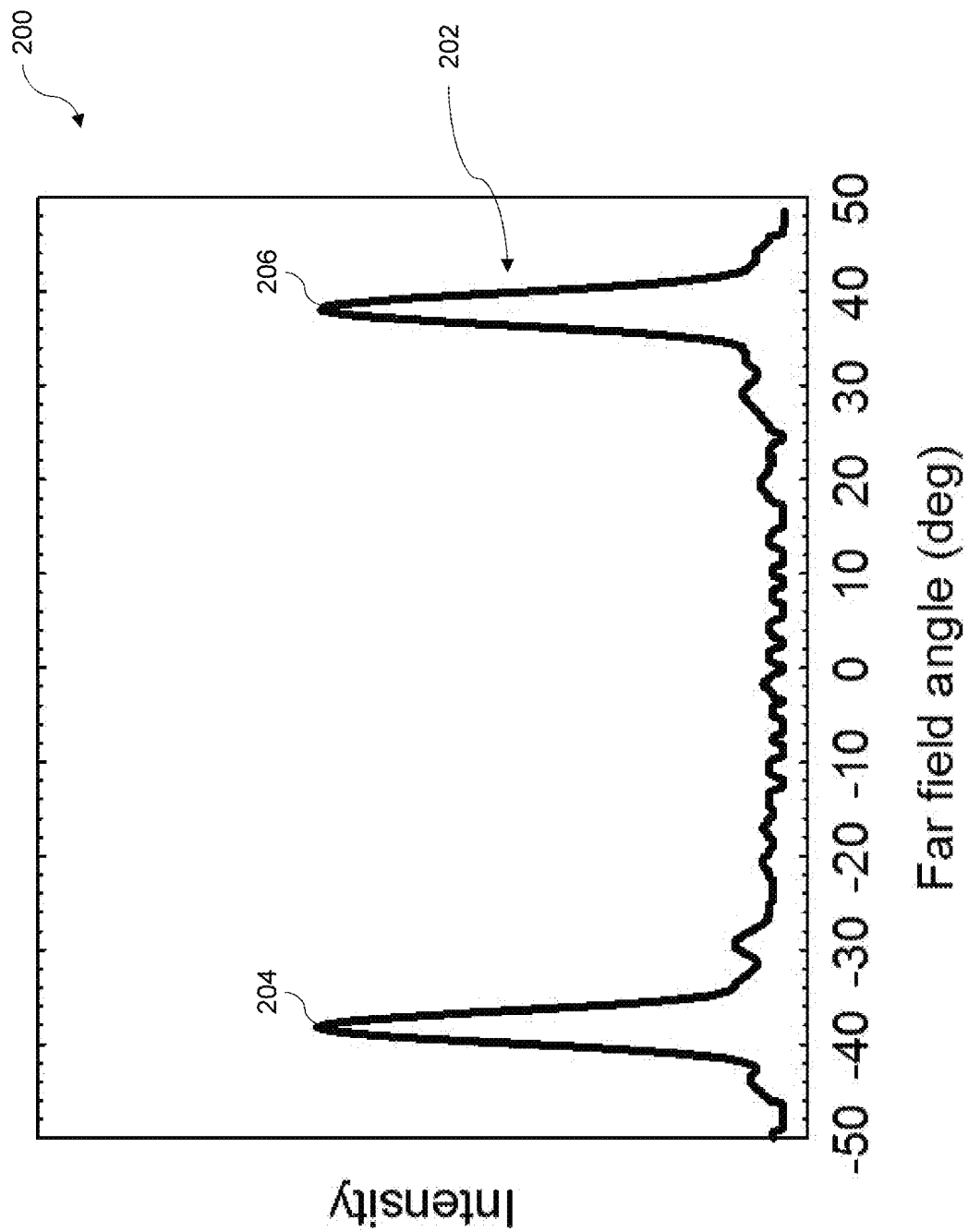
FIG. 2 is a graph showing a far field intensity profile from a BA-QCL where a high order transverse mode is operational, in accordance with the prior art.

The various methods, systems, apparatuses, and devices described herein generally include extracting and maintaining fundamental transverse mode operation in broad area quantum cascade lasers (BA-QCLs).

While this invention is susceptible of being embodied in many different forms, there is shown in the drawings and will herein be described in detail specific embodiments, with the understanding that the present disclosure is to be considered as an example of the principles of the invention and not intended to limit the invention to the specific embodiments shown and described. In the description below, like reference numerals may be used to describe the same, similar or corresponding parts in the several views of the drawings.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present invention. Thus, the appearances of such phrases or in various places throughout this specification are not necessarily all referring to the same embodiment. Furthermore, the particular features, structures, or characteristics may be combined in any suitable manner in one or more embodiments without limitation.

The term "or" as used herein is to be interpreted as an inclusive or meaning any one or any combination. Therefore, "A, B or C" means "any of the following: A; B; C; A and B; A and C; B and C; A, B and C." An exception to this definition will occur only when a combination of elements, functions, steps or acts are in some way inherently mutually exclusive. Also, grammatical conjunctions are intended to express any and all disjunctive and conjunctive combinations of conjoined clauses, sentences, words, and the like, unless otherwise stated or clear from the context. Thus, the term "or" should generally be understood to mean "and/or" and so forth.

All documents mentioned herein are hereby incorporated by reference in their entirety. References to items in the singular should be understood to include items in the plural, and vice versa, unless explicitly stated otherwise or clear from the text.

Recitation of ranges of values herein are not intended to be limiting, referring instead individually to any and all values falling within the range, unless otherwise indicated, and each separate value within such a range is incorporated into the specification as if it were individually recited herein. The words "about," "approximately," or the like, when accompanying a numerical value, are to be construed as indicating a deviation as would be appreciated by one of ordinary skill in the art to operate satisfactorily for an intended purpose. Ranges of values and/or numeric values are provided herein as examples only, and do not constitute a limitation on the scope of the described embodiments. The use of any and all examples, or exemplary language ("e.g.," "such as," or the like) provided herein, is intended merely to better illuminate the embodiments and does not pose a limitation on the scope of the embodiments. No language in the specification should be construed as indicating any unclaimed element as essential to the practice of the embodiments.

For simplicity and clarity of illustration, reference numerals may be repeated among the figures to indicate corresponding or analogous elements. Numerous details are set forth to provide an understanding of the embodiments described herein. The embodiments may be practiced without these details. In other instances, well-known methods, procedures, and components have not been described in detail to avoid obscuring the embodiments described. The description is not to be considered as limited to the scope of the embodiments described herein.

In the following description, it is understood that terms such as "first," "second," "top," "bottom," "up," "down," "above," "below," and the like, are words of convenience and are not to be construed as limiting terms. Also, the terms apparatus and device may be used interchangeably in this text.

In general, the devices, systems, and methods described herein may include a broad area quantum cascade laser (BA-QCL) with fundamental transverse mode operation, and more specifically to techniques for obtaining and maintaining the fundamental transverse mode operation in BA-QCLs. As such, the disclosure relates generally to semiconductor light sources, and more particularly, to quantum cascade laser (QCL) devices that emit in the mid-infrared wavelength range (e.g., about 2 µm-20 µm), as well as long-infrared wavelength ranges, e.g., the terahertz spectral range. Techniques disclosed herein may include a BA-QCL that sustains fundamental transverse mode operation, e.g., to attain higher brightness in a single beam that is relatively easy to operate. The devices, systems, and methods disclosed herein may include any of the techniques described in R. Kaspi et al., "Extracting fundamental transverse mode operation in broad area quantum cascade lasers," APPLIED PHYSICS LETTERS 109, 211102 (Nov. 23, 2016), which is hereby incorporated by reference. The devices, systems, and methods disclosed herein may also or instead be related to techniques described in U.S. patent application Ser. No. 15/676,825 filed on Aug. 14, 2017, which is hereby incorporated by reference.

As discussed above, QCLs are unipolar semiconductor lasers that use optical transitions between electronic sub-bands to produce light. QCLs can be designed to emit in the mid-infrared and long-infrared wavelength ranges of the electromagnetic spectrum. Unlike typical inter-band semiconductor lasers that emit electromagnetic radiation through the recombination of electron-hole pairs across a material band gap, QCLs are unipolar, and laser emission is achieved through the use of inter-subband transitions in a repeated stack of semiconductor multiple quantum well heterostructures. By way of example, QCLs may be used in the areas of remote sensing, long-wave imaging, communications, aircraft countermeasures, and the like.

Broad area lasers generally operate spatially and longitudinally multimode, and may be used for solid-state laser pumping, sensor technology, material processing, medical applications (e.g., photodynamic therapy), as well as other applications known to those of ordinary skill in the art. Broad area laser diodes (which may also be referred to in the art as broad stripe laser diodes, broad emitter laser diodes, single-emitter laser diodes, and high power diode lasers) may include edge-emitting laser diodes where the emitting region at the front facet has the general shape of a broad stripe, with dimensions of, e.g., 1 µm×100 µm.

Thus, QCLs may be the preferred choice for a variety of applications for mid-infrared and long-infrared emission from a compact source, due to their relatively high efficiency at room temperature. Power scaling in QCLs is possible by fabricating broad area devices. However, broad area QCL devices with cavity widths that exceed approximately 10 µm typically exhibit modal instability, non-linear interactions, beam steering, and loss of brightness. When the cavity width is very large, e.g., greater than 30 µm, high order transverse modes generally result in a far field profile that is double-lobed, with each lobe propagating at large angles from the optical axis. Often a single or a small number of high order transverse modes are operational, because, unlike the typical inter-band diode laser, filamentation may be naturally suppressed in QCLs. Multi-lobed emission is a large obstacle to producing practical BA-QCL devices with high brightness.

As such, although fabricating broad area devices may be the simplest method to scale the power of QCLs, in the broad area devices, high-order transverse modes are operational and may inhibit single beam emission and reduce brightness. Thus, scaling brightness in QCLs may be severely limited by the emergence of the high order transverse modes as the laser cavity is made larger. To this end, as discussed herein, the disclosed techniques may improve upon current technologies that instead result in high-order transverse modes. For example, without using techniques disclosed herein, if a QCL was fabricated with a cavity width of approximately 50 micrometers to increase output power, the ensuing beam may have approximately half the power propagating at an angle of about +35 degrees, and the other half of the power propagating at an angle of about −35 degrees from the optical axis of the device. Such an apparently dual beam device may lose half of its potential brightness, and would be relatively difficult to operate as it will not have a single well controlled emission beam along the optical axis.

Several attempts have been made in the prior art to fabricate a BA-QCL that sustains fundamental transverse mode operation, and a few are described below by way of example. The disclosed techniques of the present teachings may include improvements over each of the following examples.

In a first example, a porous structure was incorporated in the cavity along the entire length of the BA-QCL by electrochemical etching, and this was reported to suppress higher order transverse modes—see, e.g., Zhao et al., J. APPL. PHYS. 112, 013111 (2012), which is hereby incorporated by reference. However, a porous structure is not something that can easily be incorporated into a typical QCL fabrication process.

In a second example, a gain guided BA-QCL without distinct sidewalls was demonstrated to favor fundamental transverse mode operation because high order transverse modes cannot be sustained without the sidewalls—see, e.g., Sergachev et al., OPT. EXPRESS 24, 19063 (2016), which is hereby incorporated by reference. However, in this example, due to current spreading, the divergence angle of the fundamental mode varied with the level of current injection, making the laser output characteristics become unpredictable.

In a third example, an angled cavity shape, i.e., a parallelogram with angles that are not 90 degrees, was used as a BA-QCL cavity to filter high order transverse modes—see, e.g., Heydari et al., APPL PHYS. LETT. 106, 91105 (2015), which is hereby incorporated by reference. However, in this example, the facet angles and the cavity length must be precisely controlled in order to produce a single lobed output beam from the fundamental mode.

In a fourth example, two short trenches were placed in a narrow (w=10 micrometers) cavity QCL device to suppress the emergence of the higher order transverse mode—see, e.g., Bouzi et al., APPL. PHYS. LETT. 102, 122105 (2013), which is hereby incorporated by reference. However, as discussed above, it was concluded that high order mode suppression only occurred when the trenches were filled with a metal to provide sufficient losses to the high order mode, and no BA-QCL cavity widths were explored.

In a fifth example, BA-QCL devices emitting in the terahertz wavelength range were reported to have high order transverse modes suppression when plasmon layers at the edges of the top metal cladding were exposed to provide losses to the high order transverse modes—see, e.g., Fan et al., APPL. PHYS. LETT. 92, 031106 (2008), which is hereby incorporated by reference. However, the plasmon layers are not incorporated into QCL devices emitting at mid-infrared wavelengths.

Thus, as demonstrated by the above examples, BA-QCLs that extract and maintain fundamental transverse mode operation are desirable, particularly if compatible with mass-fabrication methods. Devices, systems, and methods described herein may be used to this end. More specifically, devices, systems, and methods described herein may suppress high-order transverse modes by including a controlled amount of lossy material (e.g., metal) that contacts, or is in close proximity to, sidewalls of a BA-QCL, where in other BA-QCLs, lossy material would be completely absent. The lossy material that contacts, or is in close proximity to, the sidewalls may provide sufficient levels of distributed losses to the high order transverse modes to suppress them in favor of the fundamental mode (or near-fundamental transverse mode operation). In this manner, while BA-QCL power and slope efficiency may be degraded by a small amount, techniques described herein can result in a large increase in brightness to accompany the power scaling. These techniques may be translatable to all commonly practiced semiconductor fabrication methods, and may result in the scaling of brightness in BA-QCLs. As a result, in certain implementations described herein, fundamental transverse mode operation in BA-QCLs can be restored, recovering single beam emission with relatively high brightness, thus making BA-QCLs more useful in many applications.

Stated otherwise, because power scaling in BA-QCLs results in the operation of high order transverse modes with a far-field profile including two lobes propagating at large angles relative to the optical axis, disclosed herein are techniques for suppressing the high order transverse modes that can extract the fundamental transverse mode and provide emission along the optical axis. That is, because the various transverse modes are nearly competitive with each other with small mode discrimination between them, and that mode overlap with the sidewalls increases with the mode number, any loss introduced at the sidewalls that scales with a mode's overlap may act selectively in favor of lower order transverse modes. Thus, the present teachings may be adapted to produce fundamental transverse mode operation in a mid-infrared BA-QCLs, e.g., using processes that are easily incorporated into standard photolithographic fabrication or other mass-production processes.

Implementations may include a BA-QCL in which the fundamental transverse mode operation can be sustained even when the cavity width is enlarged to produce higher power by using a distributed loss method to suppress high order transverse modes in BA-QCLs. In particular, by extending a lossy material over a sidewall of a BA-QCL, the mode selection in the optical cavity may be altered from having only high order transverse modes to regaining fundamental mode emission. Thus, a specific disposition of a lossy material or lossy layer(s) may alter the mode selection in the optical cavity of a BA-QCL from one where high order transverse modes dominate and the laser output is multi-lobed in character to a laser output that is single lobed in character.

For context, FIG. 1A is a top view of a representation of a generic BA-QCL 100 and FIG. 1B is a front view of the BA-QCL 100. More specifically, FIG. 1B is a sectional view through Section A-A of FIG. 1A.

FIGS. 1A and 1B show the optical cavity 110, which may approximate a uniform box whose geometry is defined by the cavity width 112, the cavity length 114, and sidewalls 116 that are etched to a depth below an active region 120. When the sidewalls 116 are metal terminated, which may be a typical fabrication method of BA-QCLs 100, the near field of the transverse mode in the optical cavity 110 may be described as a sinusoidal function, i.e., the solution to the Hemholtz equation, as shown by the sinusoidal curve 130 in FIG. 1B. Each of these sinusoidal functions may have a near field amplitude A(z), written as $A(z)=\sin(N\pi z/w)$, where N is the transverse mode number and w is the cavity width 112. Each of these sinusoidal functions in the near field may, in turn, produce a far-field intensity distribution in which lobes will appear at angles $\pm\Theta$, where $\Theta=\arcsin(\lambda N/2w)$, where X is the wavelength.

Among the many sinusoidal functions defined by N=1, 2, 3, and so on, a particular one may have the most advantageous gain versus loss characteristics, and will become operational. When the cavity width 112 is relatively small (e.g., w<10 micrometers), then the most advantageous mode may be N=1, otherwise referred to as the TM00, or the fundamental mode. That is, the angle $\pm\Theta$ may be near zero degrees from the optical axis 102 of the laser, thus forming a single beam.

FIG. 2 is a graph 200 showing a far field intensity profile 202, e.g., for the BA-QCL 100 shown in FIGS. 1A and 1B, i.e., where a high order transverse mode is operational. When the width of the optical cavity 110 is relatively large (e.g. w≈90 micrometers), as in a BA-QCL 100, the most advantageous transverse mode may have a large N, and two lobes 204, 206 in the far field will be centered at $+\Theta$ and $-\Theta$ degrees from the optical axis 102, as exemplified by the data shown in FIG. 2. In this example, the far field intensity profile 202 from a BA-QCL 100 with w=100 micrometers and λ=4.85 μm is shown. The two lobes 204, 206 are centered at about +38 degrees, corresponding to a transverse mode number N=23. Such a high order transverse mode is schematically depicted as a generic sinusoidal curve 130 in FIG. 1B.

By way of analogy, the various transverse modes N=1, 2, 3, and so on, can be thought of as being in competition with each other. If all modes were equally competitive, then perhaps they could all co-exist. In certain lasers, if not equally competitive, many of these transverse modes in BA-QCLs are nearly competitive. In other words, there may only be a small preference for a particular high order transverse mode over the others. Thus, the dependence of threshold gain versus mode number may be quite shallow. In this manner, occasionally two or three different transverse modes that are nearly-competitive may co-exist in the same BA-QCL.

In the disclosed techniques, lossy material disposed on the sidewalls of a BA-QCL, if placed according to the teachings of the present disclosure, may drastically change the mode selection behavior in the BA-QCL in favor of the fundamental mode. Before describing the placement of lossy material on or near the sidewalls of a BA-QCL, a common BA-QCL will be described with reference to FIGS. 3 and 4.

Figure 3:
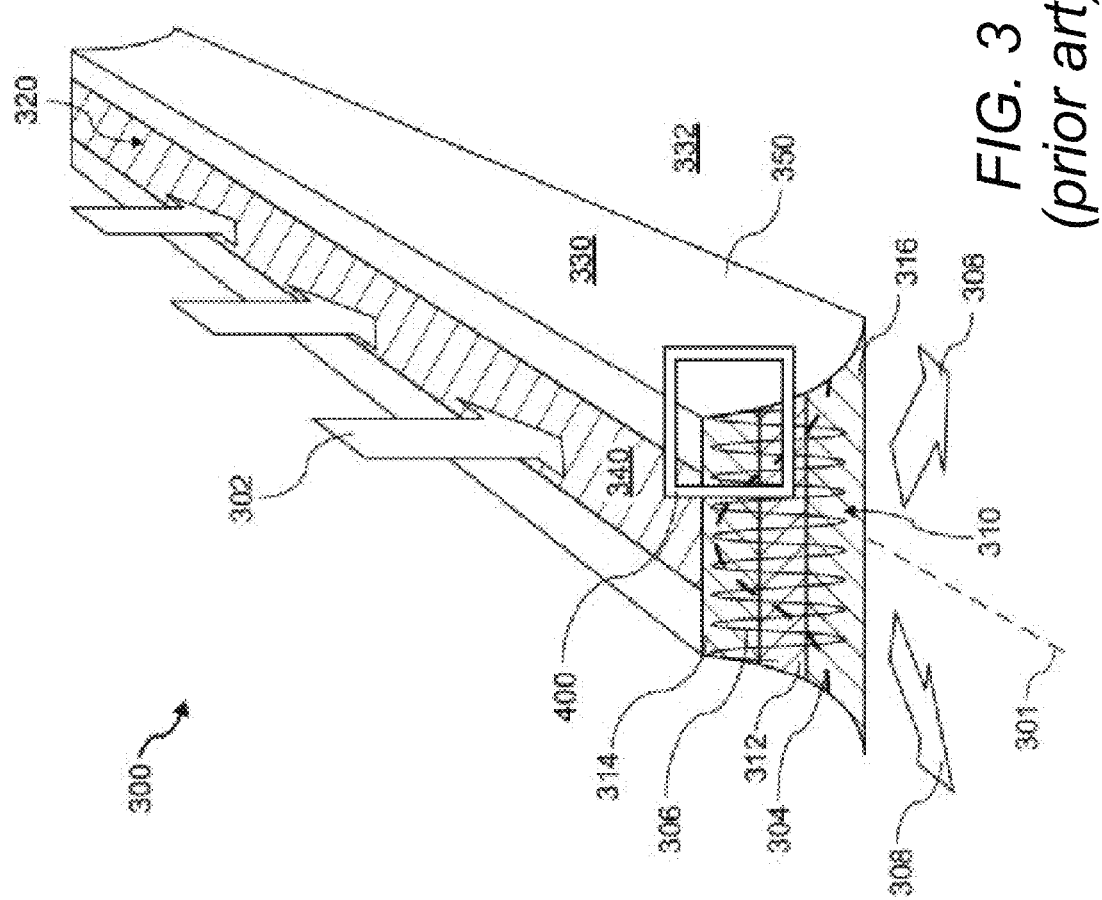
FIG. 3 illustrates a BA-QCL, in accordance with the prior art.

FIG. 3 illustrates a BA-QCL, in accordance with the prior art. As shown in the figure, the BA-QCL 300 includes an optical cavity 310 defined by a top surface 320 and two sidewalls 330. The optical cavity 310 may include an active region 312 disposed between a top cladding 314 and a bottom cladding 316. The active region 312 may be the region of the BA-QCL 300 where photons are produced when a current 302 is applied thereto. The sidewalls 330 may be formed by channels 332 that further define the optical cavity 310, where the channels 332 may be formed by chemical etching or another similar manufacturing process.

As further shown in the figure, in a standard BA-QCL 300, a lossy material 340 may be disposed on the top surface 320 of the BA-QCL 300, and a low-loss material 350 may be disposed on the sidewalls 330 of the BA-QCL 300. In many applications, the lossy material 340 includes a metal layer to inject a current 302 into the BA-QCL 300, and the low-loss material 350 includes a dielectric layer to protect the optical cavity 310 of the BA-QCL 300.

The figure also shows a representation of the fundamental transverse mode 304, which has little interaction with the edge or sidewalls 330 of the BA-QCL 300. The fundamental transverse mode 304 is not operational in the BA-QCL 300 shown in the figure. The figure also shows a representation of the typical high-order transverse mode 306, which has high interaction with the edge or sidewalls 330 of the device BA-QCL 300. These high-order transverse modes 306 are the operating mode in the BA-QCL 300 shown in the figure. Thus, the figure shows emission 308 of the BA-QCL 300 as two lobes from the high order transverse mode 306, where the lobes are not aligned along the optical axis 301.

Figure 4:
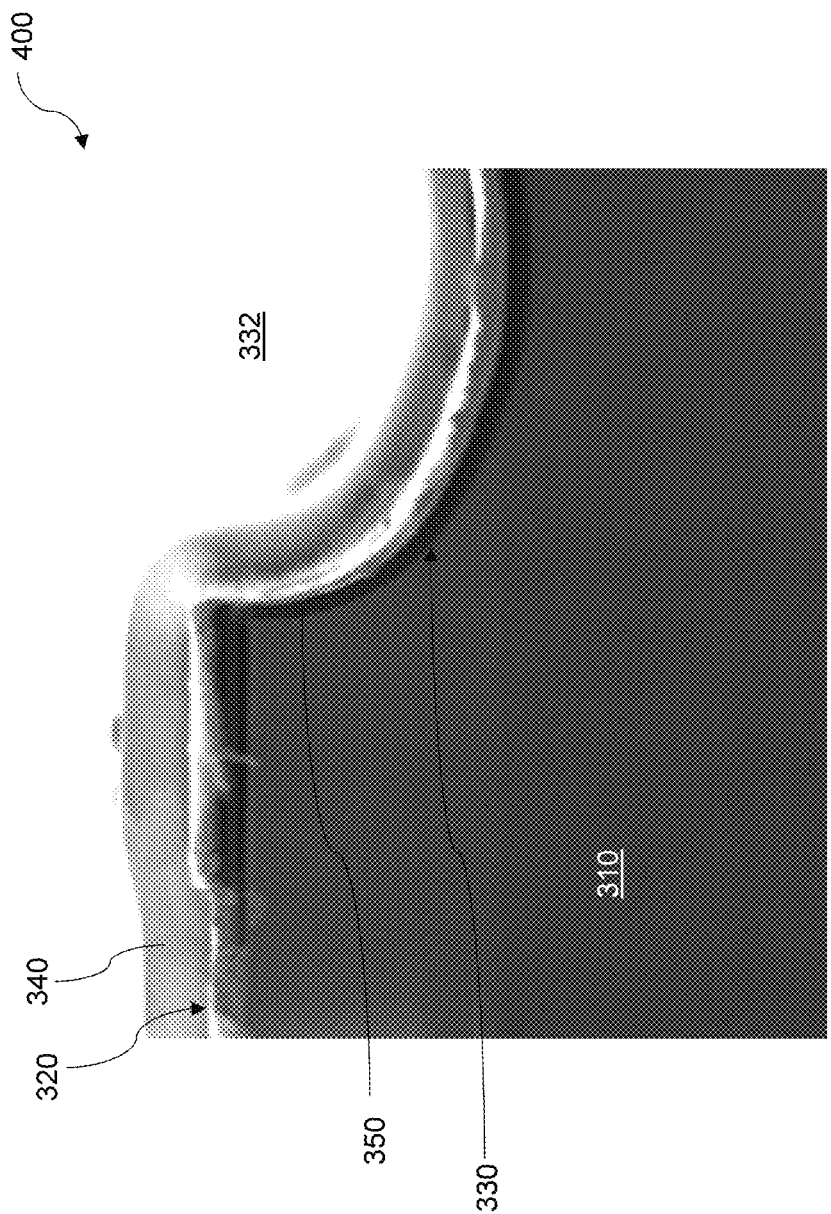
FIG. 4 is an image of a cross-sectional view through a BA-QCL, in accordance with the prior art.

The boxed region 400 shown in FIG. 3 is depicted in FIG. 4. Specifically, FIG. 4 is an image of a cross-sectional view through a BA-QCL, i.e., a view of the boxed region 400 shown in FIG. 3 as captured by a scanning electron microscope, where the lossy material 340 and the low-loss material 350 are shown. As shown in FIG. 3 and FIG. 4, the lossy material 340 does not contact the sidewalls 330 of the device BA-QCL 300, but is physically separated by a layer of the low-loss material 350.

A procedure to manufacture the BA-QCL 300 shown in these figures may include forming two relatively deep channels 332 (e.g., using chemically etching or the like) along the length of a device that define the width of the BA-QCL 300. These channels 332 may then be covered with a low-loss material 350 (e.g., a dielectric film) that protects the optical cavity 310 from losses. The low-loss material 350 may then be removed from the top surface 320 of the BA-QCL 300 to create an opening for the lossy material 340 (e.g., a metal layer) through which the electrical current will be introduced to contact the optical cavity 310. Typically, direct contact between the lossy material 340 and other portions of the optical cavity 310 elsewhere in the waveguide is avoided because contact with a lossy material 340 such as metal (e.g., gold, silver, and the like) provides optical losses, and would be expected to cause the BA-QCL 300 to fail.

However, in the present teachings, and as described with reference to the figures that follow, a modification to the standard fabrication procedure may result in a small breach in the dielectric protective layer, allowing a metal over-layer to make contact with the sides of a BA-QCL. This contact can cause preferential loss to the optical modes that reach the metal. If the metal contact persists along the length of the device, a distributive loss can be provided to the optical modes that reach the metal. In other words, the loss may be distributed along the entire length of the QCL device in certain implementations.

Figure 5:
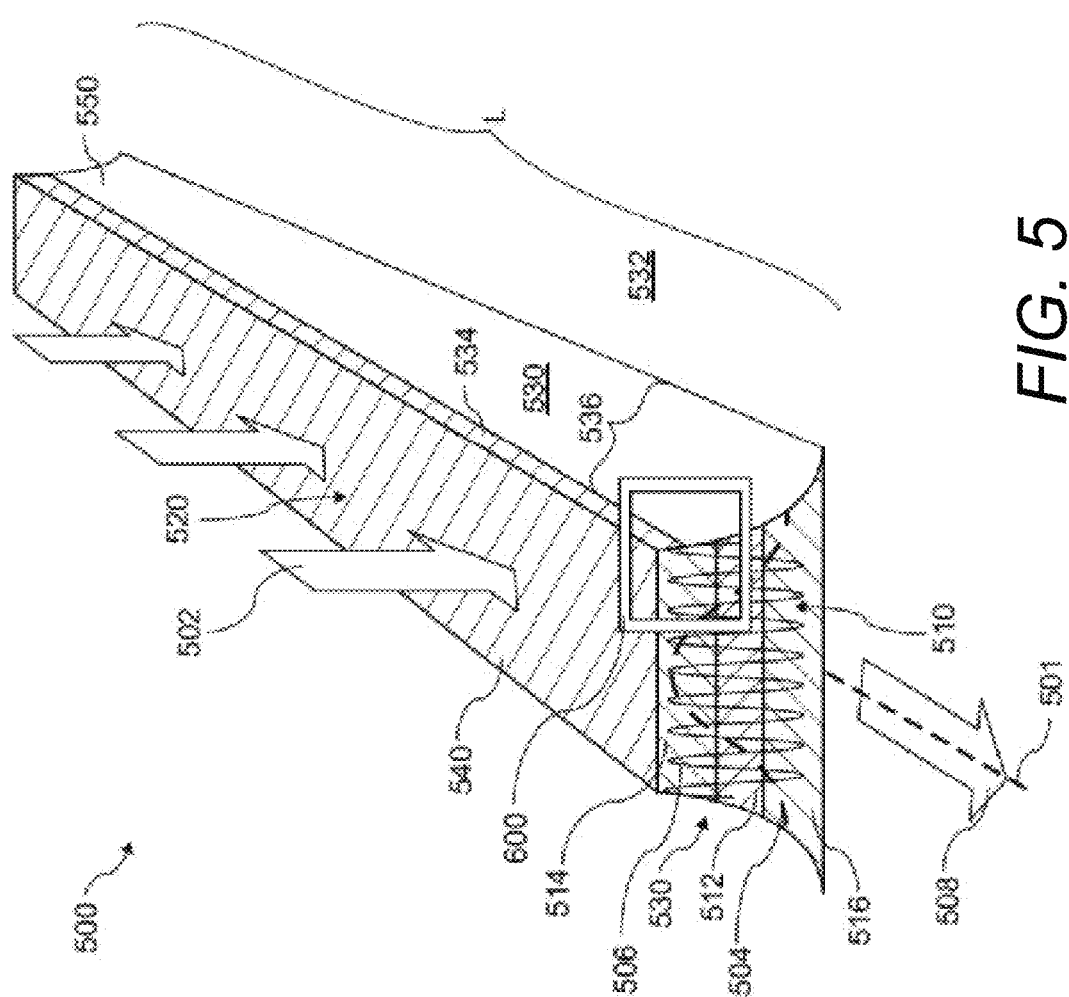
FIG. 5 illustrates a BA-QCL, in accordance with a representative embodiment.

FIG. 5 illustrates a BA-QCL, in accordance with a representative embodiment. Similar to the BA-QCL 300 discussed above with reference to FIGS. 3 and 4, the BA-QCL 500 here may include an optical cavity 510 defined by a top surface 520 and two sidewalls 530.

The optical cavity 510 may be disposed between the two sidewalls 530, where the optical cavity 510 includes an active region 512 for producing photons when a current 502 is applied thereto. The active region 512 may be disposed between a top cladding 514 and a bottom cladding 516. The optical cavity 510 may be subject to a presence of at least one high order transverse optical mode 506 due to its broad area geometry.

The sidewalls 530 may be defined by two channels 532, i.e., formed to define the optical cavity 510. The channels 532 may be formed by chemical etching process or another similar manufacturing process.

In contrast to the BA-QCL 300 discussed above with reference to FIGS. 3 and 4, the BA-QCL 500 of FIG. 5 may include a lossy material 540 disposed on at least a portion of the sidewalls 530 in addition to being disposed on at least a portion of the top surface 520. That is, in certain implementations, an optically lossy material 540 may be disposed on at least a first portion 534 of one or more of the two sidewalls 530. The BA-QCL 500 may further include an optically low-loss material 550 disposed on at least a second portion 536 of one or more of the two sidewalls 530. The optically lossy material 540 may not be in physical contact with the active region 512, as this would cause an electrical short in the BA-QCL 500. Instead, the second portion 536 that includes the low-loss material 550 may be in physical contact with the active region 512. Thus, in an implementation, a low-loss material 550 such as a dielectric layer may be disposed on at least the second portion 536 of each of the two sidewalls 530 along at least a first length of the optical cavity 510, e.g., where the dielectric layer is disposed adjacent to the active region 512.

In this manner, in the BA-QCL 500, due to a manufacturing process modification (such as any described below), the lossy material 540 (e.g., a metal layer) may extend to at least part of the sidewall 530 of the BA-QCL 500 waveguide, which can cause distributed losses to high order transverse modes 506 and promote selection of the fundamental transverse mode 504. To further illustrate this concept, the figure shows a representation of the fundamental transverse mode 504, which has little interaction with the edge or sidewalls 530 of the BA-QCL 500. Thus, the fundamental transverse mode 504 may not be affected by the distributed losses, and can thus become operational in the BA-QCL 500. In this manner, the figure shows the emission 508 of the BA-QCL 500 as a single lobe from the fundamental transverse mode 504, which may be aligned along the optical axis 501 disposed along the length L of the BA-QCL 500.

The optically lossy material 540 may thus be positioned along one or more of the two sidewalls 530 to cause optical losses to transverse optical modes that would operate during use of the BA-QCL 500. That is, the electric fields of these transverse optical modes that penetrate the sidewall 530 may experience losses because of the optically lossy material 540 disposed thereon. As discussed above, the optical cavity 510 of the BA-QCL 500 may be subject to a presence of at least one high order transverse optical mode 506 due to its broad area geometry, but the optically lossy material 540 may cause loss to the high order transverse optical mode(s) 506 due to its positioning along the first portion 534 of the sidewalls 530.

The optically lossy material 540 may include a metal. For example, the optically lossy material 540 may be defined by a metal layer disposed on the first portion 534 of the sidewalls 530 and at least a portion of the top surface 520 of the BA-QCL 500. In certain implementations, the optically lossy material 540 includes one or more of gold, silver, copper, aluminum, tungsten, nickel, iron, and so on. The optically lossy material 540 may also or instead include a non-metal, i.e., any material that provides sufficient conductivity for use in a BA-QCL 500 or the like.

The optically lossy material 540 may be positioned along the two sidewalls 530 in a manner such that it does not cause an electrical short in the BA-QCL 500, e.g., due to the optically lossy material 540 not having physical contact with the active region 512. The optically lossy material 540 may also or instead be positioned along one or more of the two sidewalls 530 to cause at least a near fundamental transverse mode 504 to operate thereby producing a laser beam with a single lobe aligned with an optical axis 501 of the optical cavity 510 during operation of the BA-QCL 500.

The optically low-loss material 550 may include a dielectric material. For example, the optically low-loss material 550 may be defined by a dielectric layer disposed on at least the second portion 536 of the sidewalls 530. In certain implementations, the optically low-loss material 550 includes one or more of silicon dioxide and silicon nitride. The optically low-loss material 550 may also or instead include other materials as will be apparent to one skilled in the art.

One or more of optically lossy material 540 and the optically low-loss material 550 may be placed on the two sidewalls 530 using a photolithographic process, such as any of the processes described herein, or other manufacturing processes that will be apparent to one skilled in the art.

In general, the first portion 534 of the sidewalls 530, i.e., the region or area of the sidewalls 530 that is exposed to the optically lossy material 540 (or affects thereof), may be sized to adjust preferential loss to high order transverse optical modes 506 within the active region 512 of the optical cavity 510. In other words, the first portion 534 may be sized and shaped to cause a predetermined loss to certain optical modes during use of the BA-QCL 500. This predetermined loss may provide for the selection of the fundamental transverse optical mode 504 in the BA-QCL 500. In implementations, the predetermined loss does not cause an electrical short in the BA-QCL 500 due to the lossy material 540 (e.g., metal layer) not being in physical contact with the active region 512. To this end, the first portion 534 may be located adjacent to one or more of the top cladding 514 and the bottom cladding 516. More specifically, the first portion 534 may be disposed between the top surface 520 of the optical cavity 510 and the second portion 536 of each sidewall 530, where the second portion 536 includes a dielectric layer or another low-loss material 550 as described herein. Thus, in an implementation, the low-loss material 550 does not extend to the top surface 520 of the optical cavity 510 along at least a predetermined length of the optical cavity 510.

The first portion 534 may extend along a first length of the optical cavity 510. The first length may be the entire length L of the optical cavity 510 such that losses to at least one high order transverse optical mode 506 are distributed along the entire length L of the optical cavity 510. Instead, the first length may be less than the entire length L of the optical cavity 510 such that losses to at least one high order transverse optical mode 506 are distributed along only one or more specific portions of the entire length L of the optical cavity 510.

Figure 6:
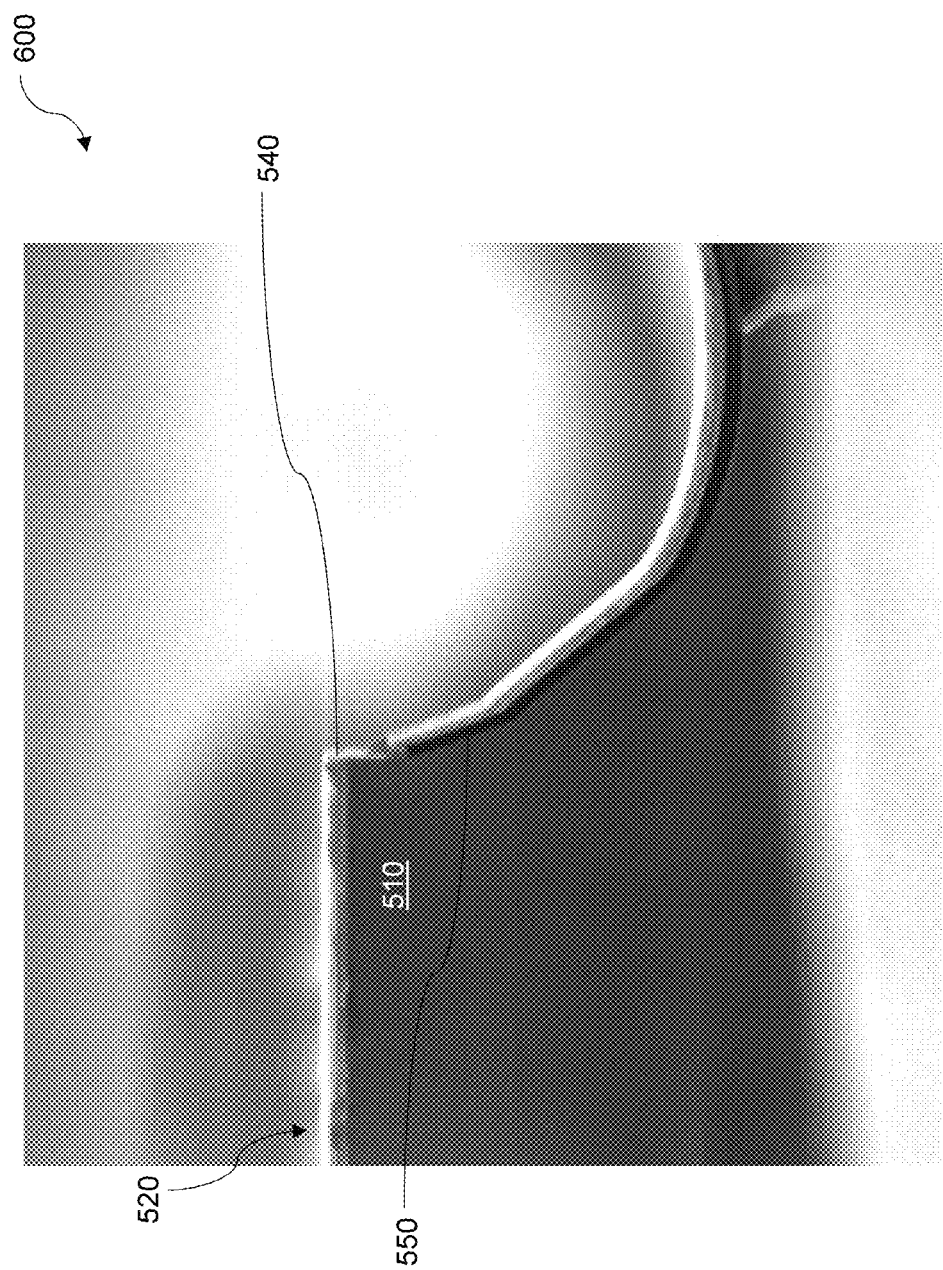
FIG. 6 is an image of a cross-sectional view through a BA-QCL, in accordance with a representative embodiment.

The boxed region 600 shown in FIG. 5 is depicted in FIG. 6. Specifically, FIG. 6 is an image of a cross-sectional view through a BA-QCL, i.e., a view of the boxed region 600 shown in FIG. 5 as captured by a scanning electron microscope, where the lossy material 540 and the low-loss material 550 are shown. As shown in FIG. 6, the low-loss material 550 (the dielectric layer shown as a dark line) does not extend to the top surface 520 of the device, allowing the lossy material 540 (metal over-layer) to make contact with the optical cavity 510.

Figure 7:
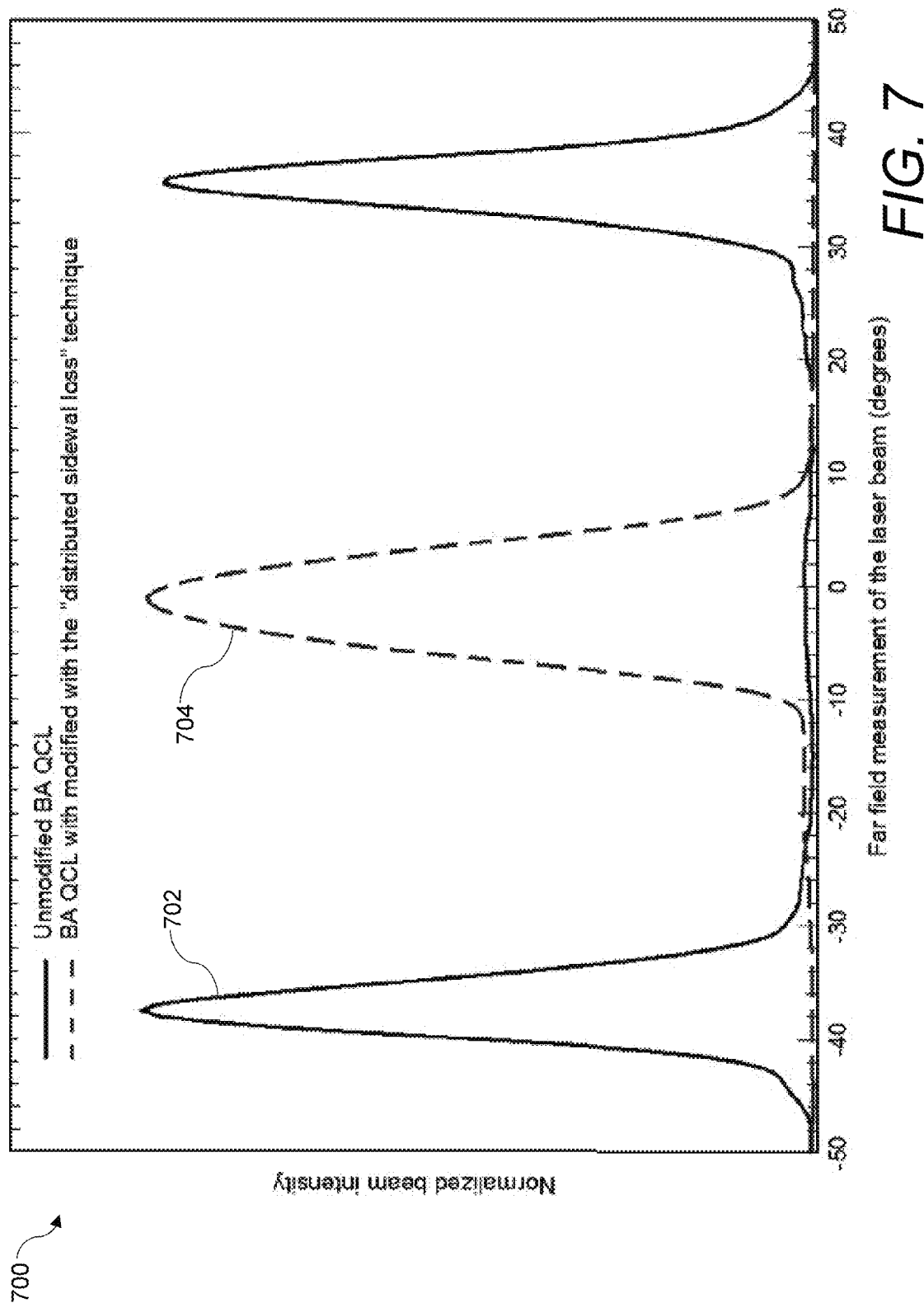
FIG. 7 is a graph showing an intensity profile from a BA-QCL, in accordance with a representative embodiment.

FIG. 7 is a graph showing an intensity profile from a BA-QCL, in accordance with a representative embodiment. The graph 700 represents example experimental results of an unmodified BA-QCL versus a BA-QCL according to the present teachings, e.g., the BA-QCLs shown in FIGS. 5 and 6 above. Specifically, the graph 700 shows a first profile 702, which represents that of an unmodified BA-QCL, and a second profile 704, which represents that of a BA-QCL according to an embodiment of the present teachings, i.e., using a "distributed loss technique" disclosed herein.

Thus, in a BA-QCL, the high order transverse modes may reach the sidewalls of the device, whereas the fundamental transverse mode may have very little presence at the sidewalls of the device. The present teachings, e.g., as described above with reference to FIGS. 5-7, may therefore include providing a distributed loss along the sidewalls or edges of a BA-QCL to preferentially suppress the high order transverse modes, allowing for the fundamental transverse mode to operate. As a result, higher brightness in a BA-QCL may be attained compared to unmodified BA-QCLs.

As described in more detail below, a method to breach a low-loss material layer (e.g., a dielectric protection layer) may involve using a chemical etching process that continues until the BA-QCL is over-etched, having a smaller lateral dimension than what would commonly be intended in the art. When the low-loss material layer is removed from the top of the over-etched device, a small portion of the low-loss material from the sidewalls may also be removed, where this amount can be controlled by the amount of over-etching. When an entire BA-QCL device is covered by a lossy material (e.g., a metal layer), then a small amount of direct contact of the sides of the waveguide with the lossy material may be achieved. In this manner, if the extent of contact of the lossy material is sufficiently large to create losses, but sufficiently small so as not to cause an electrical short in the device, then a BA-QCL with fundamental transverse mode operation may be achieved. This technique may be independent of lasing wavelength, and techniques may be easily adopted into standard photolithographic processes for BA-QCLs.

In addition to the BA-QCLs described above with reference to FIGS. 5-7, it is also or instead possible to provide a distributed loss technique where the lossy material does not contact the sidewalls of the BA-QCL, but instead is strategically located a predetermined distance from the sidewalls (or otherwise a predetermined distance relative to the active region) to provide sufficient losses to the high order transverse modes to achieve fundamental transverse mode operation in a BA-QCL.

Figure 8:
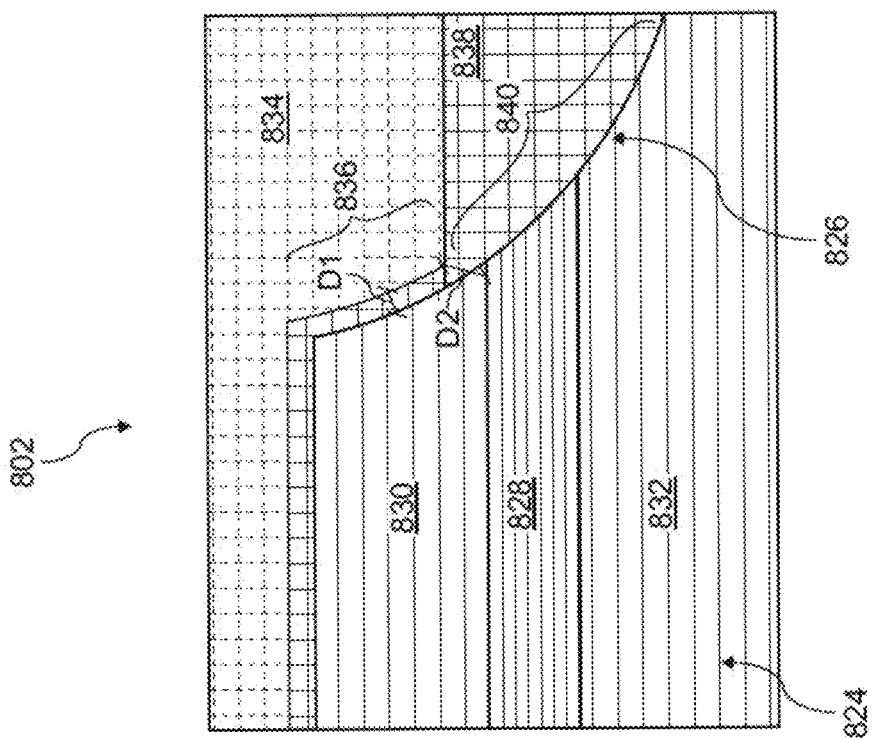
FIG. 8 illustrates cross-sectional views through BA-QCLs, in accordance with representative embodiments.
Figure 8:
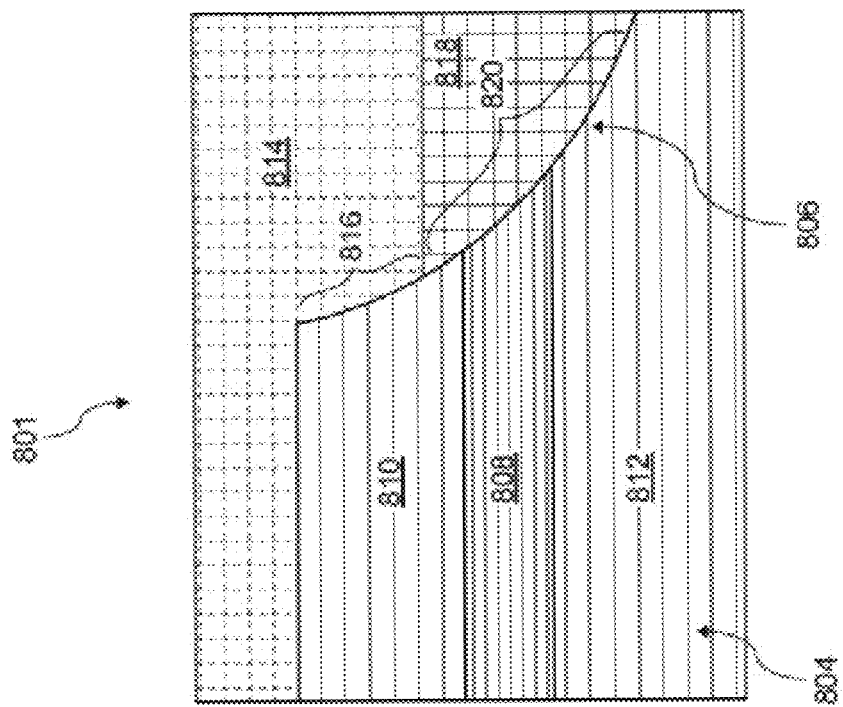

FIG. 8 illustrates cross-sectional views through BA-QCLs, in accordance with representative embodiments. Specifically, FIG. 8 shows a first BA-QCL 801 and a second BA-QCL 802.

The first BA-QCL 801 may be the same or similar to the BA-QCLs described above with reference to FIGS. 5-7, where an optical cavity 804 is disposed between two sidewalls 806 and includes an active region 808 between a top cladding 810 and a bottom cladding 812 for producing photons when a current is applied thereto. The first BA-QCL 801 may further include an optically lossy material 814 disposed on at least a first portion 816 of one or more of the two sidewalls 806, where the optically lossy material 814 is not in physical contact with the active region 808. The first BA-QCL 801 may include an optically low-loss material 818 disposed on at least a second portion 820 of one or more of the two sidewalls 806, where the second portion 820 is in physical contact with the active region 808. Thus, the first BA-QCL 801 may be structurally configured to provide a distributed loss technique that is the same or similar to the techniques provided by the devices described above with reference to FIGS. 5-7.

The second BA-QCL 802 may instead include a device where the optically lossy material 834 is not in direct contact with the sidewalls 826, but is instead placed near the sidewalls 826 at a predetermined distance (D1 or D2) selected to provide predetermined losses—e.g., losses such that high order transverse modes are suppressed leaving only the fundamental transverse mode to operate. Specifically, the second BA-QCL 802 may include an optical cavity 824 disposed between two sidewalls 826, the optical cavity 824 including an active region 828 between a top cladding 830 and a bottom cladding 832 for producing photons when a current is applied thereto, and an optically low-loss material 838 disposed on each of the two sidewalls 826. The second BA-QCL 802 may further include an optically lossy material 834 disposed over at least a portion of the optically low-loss material 838 such that the optically lossy material 834 is disposed a predetermined distance (D1 or D2) from the sidewall 826. The predetermined distance (D1 or D2) may be selected such that the optically lossy material 834 induces losses to at least one high order transverse optical mode present in the optical cavity 824 due to its broad area geometry.

The predetermined distance (D1 or D2) may be selected to adjust preferential loss to at least one high order transverse optical mode within the active region 828 of the optical cavity 824. As shown in the figure, the predetermined distance D1 may be calculated or measured from the sidewalls 826, but may also or instead be calculated, measured, or otherwise related to a predetermined distance D2 between the optically lossy material 834 and the active region 828. Similar to the first BA-QCL 801, the optically lossy material 834 may be disposed so that it is not in contact with either of the two sidewalls 826 of the second BA-QCL 802.

Figure 9:
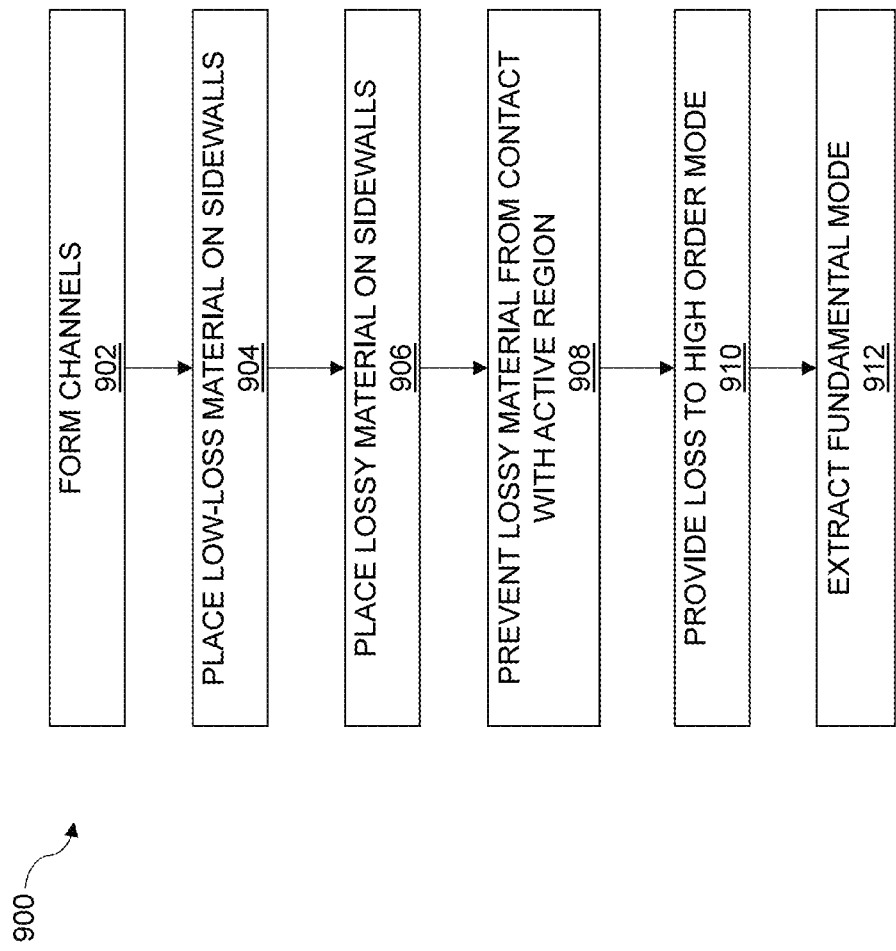
FIG. 9 is a flow chart of a method of making a BA-QCL, in accordance with a representative embodiment.

FIG. 9 is a flow chart of a method of making a BA-QCL, in accordance with a representative embodiment. The method 900 may, for example, be used to create one or more of the BA-QCLs described with reference to FIGS. 5-8, or otherwise described herein. The method 900 may also include use of any of the BA-QCLs described herein.

As shown in block 902, the method 900 may include forming channels that define at least two sidewalls for an optical cavity. The channels may be formed in a substrate using a chemical etching process or the like. Thus, this block 902 may also or instead include providing an optical cavity disposed between two sidewalls that are formed using a chemical etching process or the like, where the optical cavity includes an active region for producing photons when a current is applied thereto.

As shown in block 904, the method 900 may include placing an optically low-loss material on each of two sidewalls that define the optical cavity. The optically low-loss material may include a dielectric material as described herein. Thus, this block 902 may also or instead include placing a dielectric layer on at least a portion (e.g., the second portion as described above) of each of the two sidewalls along at least a first length of the optical cavity. The dielectric layer may be formed using a photolithographic process or the like.

As shown in block 906, the method 900 may include placing an optically lossy material on at least a first portion of each of the two sidewalls such that the optically lossy material is not in physical contact with the active region. The first portion may be sized and shaped such that the optically lossy material induces losses to at least one high order transverse optical mode present in the optical cavity due to its broad area geometry. Placing the optically lossy material on each of the two sidewalls may include placing the optically lossy material on a top surface of the optical cavity and extending the optically lossy material over edges defined by the top surface and the two sidewalls to form the first portion. The optically lossy material may include a metal, e.g., gold, as described herein. Thus, this block 906 may include placing a metal layer on at least a first portion of one or more of the two sidewalls such that the metal layer is not in physical contact with the active region. This may also or instead include placing the metal layer on a top surface of the optical cavity and extending the metal layer over edges defined by the top surface and the two sidewalls to form the first portion. The metal layer may be formed using a photolithographic process or the like. This block 906 may also include extending the first portion along a first length of the optical cavity—e.g., the entire length of the optical cavity.

As shown in block 908, the method 900 may include preventing the optically lossy material from contacting the active region. Prevention of the optically lossy material from contacting the active region may be provided by placement of the low-loss material over the active region such that the low-loss material provides a physical barrier between the active region and the lossy material.

As shown in block 910, the method 900 may include providing a loss to at least one high order transverse optical mode during use of a BA-QCL that includes the optical cavity. The loss may be provided by contact of the high order transverse optical mode with the sidewall that is in contact, at least in part, with the lossy material. Thus, this block 910 may include providing a loss to optical modes that contact the first portion during use of a BA-QCL.

As shown in block 912, the method 900 may include extracting a fundamental transverse optical mode.

A more-specific technique for creating a BA-QCL according to the present teachings will now be discussed, e.g., with reference to FIG. 10, with some test data provided by way of example thereafter.

As discussed herein, generally, lossy material (e.g., metallic layers) in contact with the optical waveguide may provide losses at optical frequencies that may depend on the penetration of the dominant electric field across the semiconductor-metal interface. In a standard dual channel fabrication of mid-infrared BA-QCLs, any contact of the waveguide sidewalls with a lossy material such as metal is specifically avoided by the presence of a low-loss material (e.g., a dielectric layer such as silicon nitride). Thus, in standard BA-QCLs, the only breach in the dielectric layer may be at the top surface to allow the deposition of a metal contact layer for current injection. The present teachings may instead include placing a lossy material (e.g., metal) in direct contact with the sidewalls of a BA-QCLs (e.g., along the entire length of the device) to provide selective losses to the high order transverse modes.

The following considerations may be taken into account when making a BA-QCL according to the present teachings (e.g., using metal to provide distributed loss to high order transverse modes). The polarization of optical modes in a BA-QCL may have an electric field component that is perpendicular to the plane of the epitaxial layers, and parallel with the sidewall of the device if the sidewalls are relatively vertical. In this case, the penetration of these modes may be relatively small as they will be "reflected" or "repelled" by the conducting boundary. However, the sidewalls may not be vertical, but instead may be significantly tilted as a result of chemical etching. Therefore, it may be expected that a more significant ohmic loss will be incurred by the penetrating transverse modes. Also, the lossy material should not be in contact with the active region, because current may sidestep the cascade region to provide an electrical short. Therefore, the area of direct contact with the lossy material should be limited to a portion of the sidewall adjacent to the top clad layer or the bottom clad layer. Despite this constraint, the larger the contact area of the lossy material, the larger the ohmic loss to the transverse modes, and the larger the potential for discrimination. Finally, the overlap of each specific transverse mode with the sidewall may be diminished as the cavity width is made larger and new transverse modes are allowed to propagate. Therefore, the effectiveness of any mode filtering may be reduced if the cavity width is further increased.

To this end, the present teachings may include a modification of a standard "dual channel" fabrication procedure to introduce a lossy material (e.g., gold) in direct contact with a small portion of the sidewalls of the BA-QCL, e.g., along the entire length of the device. Some example experimental results are provided that show that this can provide sufficient mode selectivity to extract the fundamental transverse mode in BA-QCLs where single lobed near diffraction limited emission may not otherwise be possible.

Figure 10:
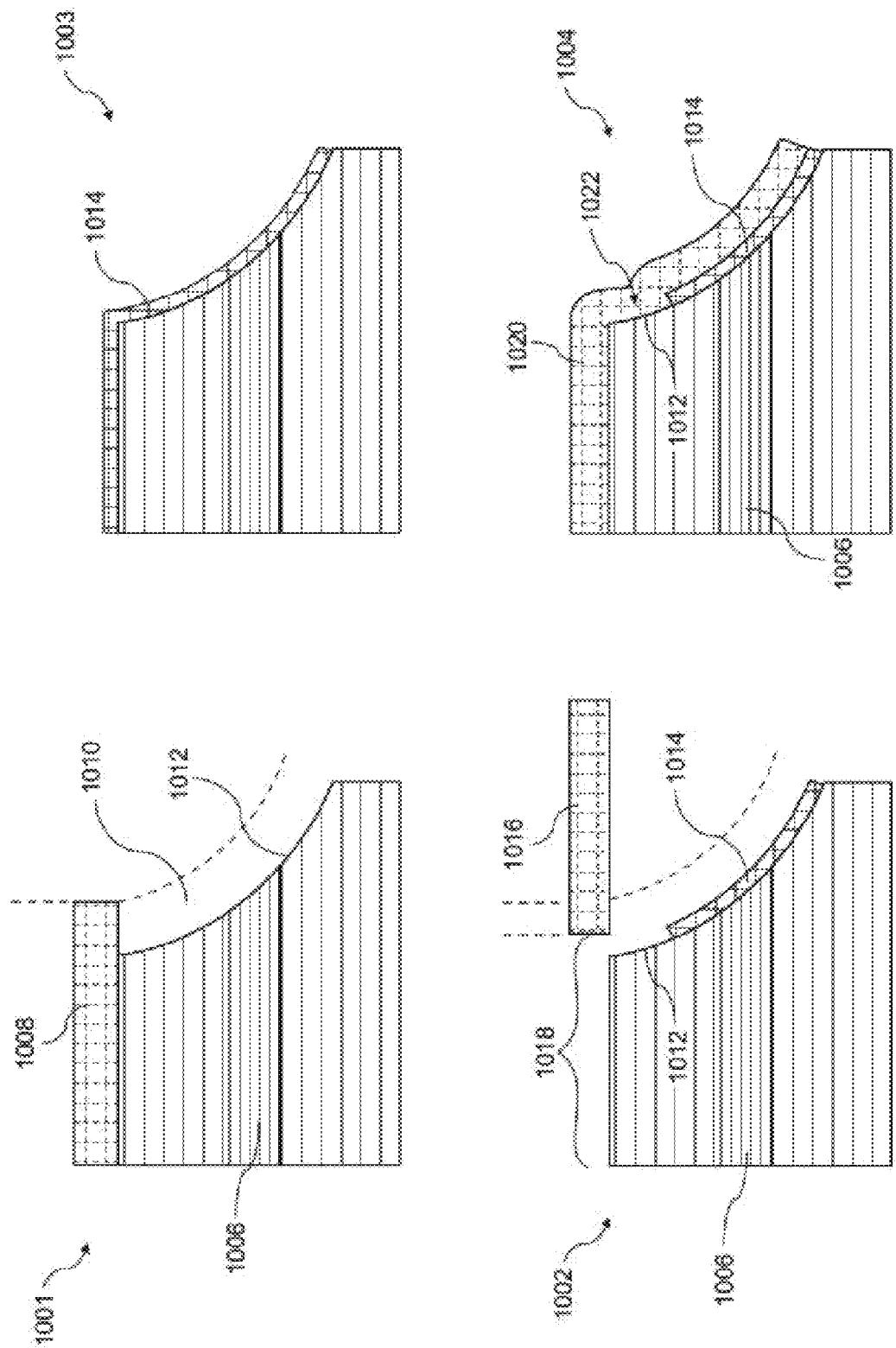
FIG. 10 illustrates a technique for making a BA-QCL, in accordance with a representative embodiment.

FIG. 10 illustrates a technique for making a BA-QCL, in accordance with a representative embodiment. Specifically, the figure shows four steps that may be taken to create a BA-QCL—a first step 1001, a second step 1002, a third step 1003, and a fourth step 1004.

As shown in the first step 1001, after initial masking of the surface with a photoresist material 1008, the channels are deliberately over-etched, as shown by line 1010, such that the sidewall 1012 extends beyond the masked aperture. As shown in the second step 1002, a low-loss material 1014, e.g., a silicon nitride dielectric layer, may then be applied. After depositing of the low-loss material 1014, as shown in the third step 1003, another photoresist mask 1016 may be used to remove the low-loss material 1014 from a section 1018 of the top surface of the device and to allow the lossy material 1020 (e.g., a gold over-layer) to have access to the device as the top contact. The over-etching may not be simply contained to the top of the device, but may extend slightly to the sidewalls 1012 of the device. As shown in the fourth step 1004, the lossy material 1020 may be deposited. Consequently, when the lossy material 1020 is deposited, a portion 1022 of the sidewalls 1012 may make direct contact with the lossy material 1020 along the length of the cavity on both sides of the device. The extent of this contact may be controlled by the amount of over-etching.

Thus, a technique for making a BA-QCL may include over-etching a channel, depositing a low-loss material (as insulation), removing some of the low-loss material, and depositing a lossy material.

Stated otherwise, a technique according to the present teachings may include forming channels in a substrate that define sidewalls of an optical cavity that includes an active region disposed between a top cladding and a bottom cladding. The channels may be formed using a chemical etching process or the like. Prior to etching, the substrate may be masked with a photo-resistant material or the like, thereby forming a masked surface. At least one of the channels may be etched to extend beyond the masked surface. The method may further include placing a dielectric layer (e.g., silicon nitride) on each of the sidewalls, where the dielectric layer is disposed adjacent to the active region. The dielectric layer may be placed over the top surface of the optical cavity and the channels. For example, this may include masking at least a second portion of each of the sidewalls with a photo-resistant material. The method may further include removing a portion of the dielectric layer from a first portion of each of the sidewalls—e.g., etching the dielectric layer from the top surface of the optical cavity and the first portion of each of the sidewalls. The method may also include placing a metal layer (e.g., gold) on a top surface of the optical cavity and at least the first portion of each of the sidewalls, where the metal layer is not in physical contact with the active region. In this manner, formation of the channels may be controlled to provide an application surface for the metal layer on the first portion.

Figure 11:
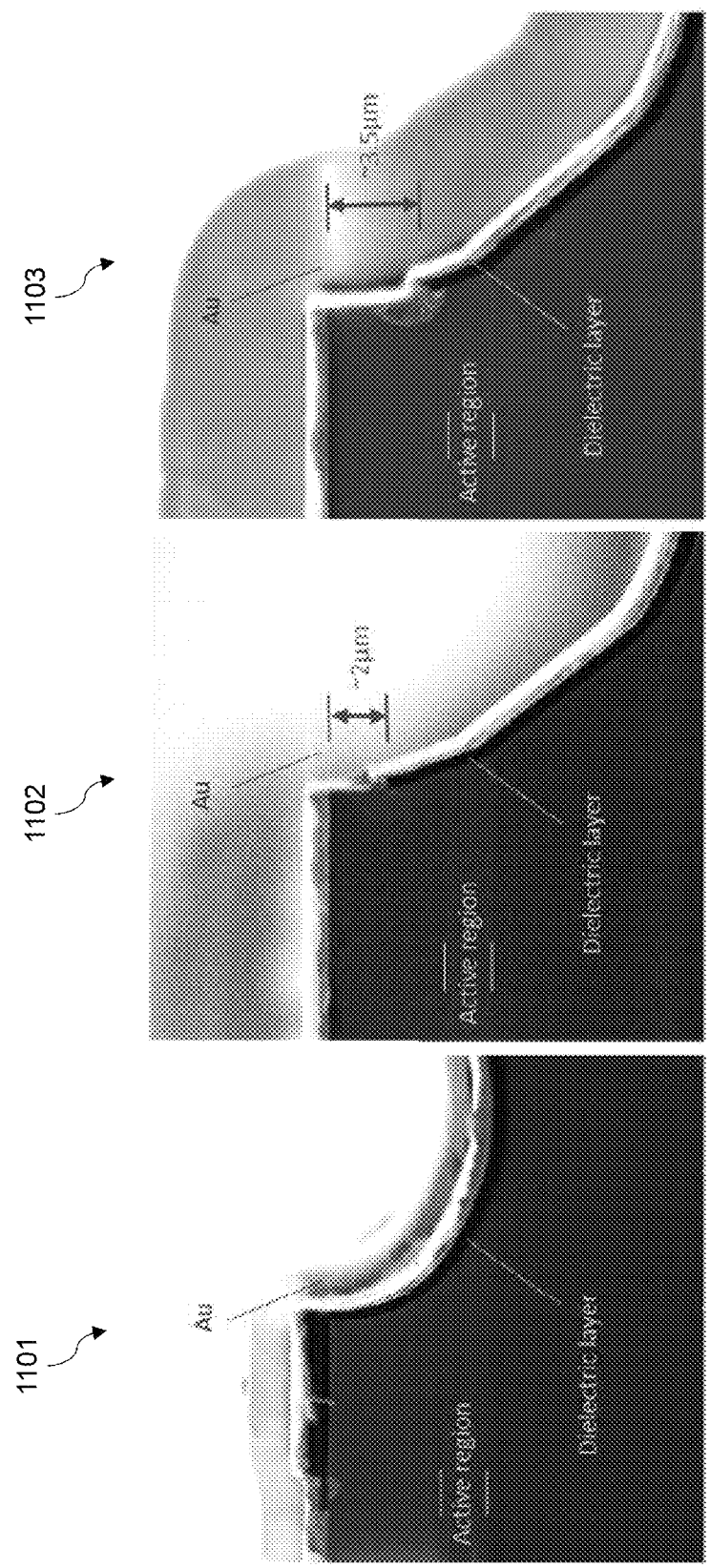
FIG. 11 shows images of various BA-QCLs.

FIG. 11 shows images of various BA-QCLs. The BA-QCLs are provided by way of example, where various example experimental results are also discussed with reference to these BA-QCLs. In this specific example discussed herein, the BA-QCL structure includes an n-InP(001) substrate using gas source molecular beam epitaxy, with an active region 1006 having 40 stages designed to emit near 4.8 μm. The InP top clad thickness is about 4 micrometers.

Specifically, FIG. 11 shows images taken from a scanning electron microscope of BA-QCLs fabricated from the same wafer with different channel depths, and consequently, a different amount of over-etching and different depths of direct metal contact with the sidewalls. More specifically, images of one edge of a BA-QCL device are shown in which the presence of the dielectric insulator is clearly visible as the dark line. In the device shown in the first image 1101, the etch depth of the channel is relatively small, resulting in a dielectric layer that is intact along the sidewall of the device, extending to the top of the device. In contrast, the device shown in the second image 1102 has a deeper channel, with over-etching resulting in an about 2 μm section of the sidewall having direct contact with a gold layer. In the device shown in the third image 1103, the extent of direct metal contact is greater, approximately 3.5 μm.

Figure 12:
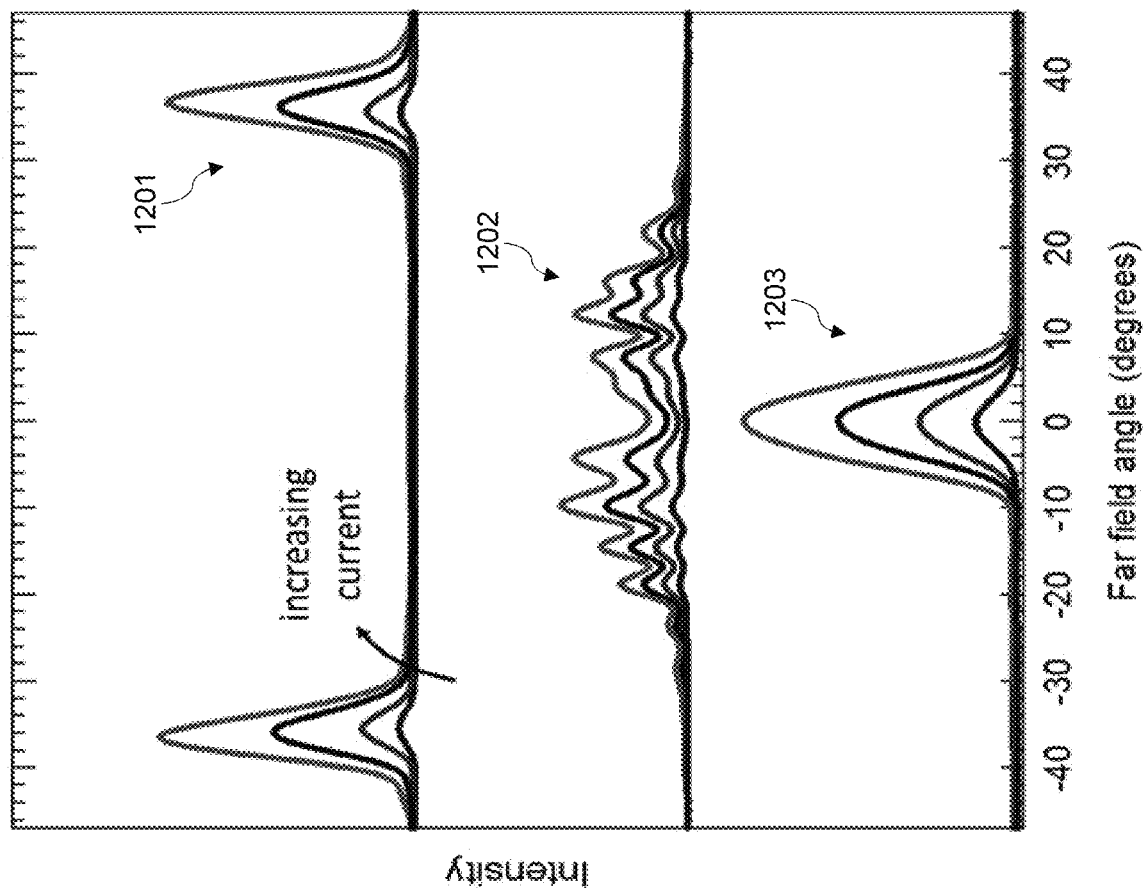
FIG. 12 is a graph showing experimental results, in accordance with a representative embodiment.

In an example experiment, the devices shown in FIG. 11, with nominal cavity dimensions of 70 μm×3 mm, were mounted without facet coatings, in the epi-up configuration, and tested at 20-degrees Celsius in the pulsed regime using 500 ns pulses with a duty cycle of 0.5% to minimize heating. Far field measurements were made using a point detector mounted on a motorized rotating pivot arm about 30 cm away from the device. Far field measurement of the emission collected from the three devices are shown in FIG. 12, which includes a graph showing experimental results. The measurements indicate a change in mode selection in each BA-QCL as a function of the sidewall metal. In the device without sidewall metal, shown in the first set of curves 1201, the far-field is dual lobed, at ±38 degrees, indicative of a stable high order transverse mode. The high order transverse modes are described by:

$$\sin\theta_M = \frac{\lambda(M-1)}{2w}$$

where M is the mode number with M=1, 2, 3, 4 ... ≤2w/λ, $\theta_M$ is the emission angle of the lobes outside of the cavity, λ is the emission wavelength, and w is the cavity width, thus in this experimental case M=19. It should be noted that this mode is relatively stable as injection current is increased from near threshold to about a 2.5 times threshold. By contrast, in the far-field spectrum collected from the device with sidewall metal contact of about 2 μm, the two lobes are replaced by a multitude of lower intensity lobes contained within a smaller range of angles, as shown by the second set of curves 1202. This indicates that the stable mode M=19 is suppressed in favor of several lower-order modes that are simultaneously operational. While interaction between modes may be present, their collective behavior may not vary with increasing injection current.

In the BA-QCL device where direct contact of the sidewall and metal extends to about 3.5 μm, the far field spectrum is a single lobed emission centered along the optical axis of the device. It should again be noted that the far field spectra are stable within the range of injection current tested, as shown in third set of curves 1203. In this device, the cavity width is diminished from the nominal value of about 70 μm to about 60 μm due to over-etching. The measured half-width of the emission lobe is about 120 mrad, giving a beam parameter product (BPP) of about 3.6 mm*mrad. For comparison, a diffraction limited Gaussian beam from this device lasing at λ~4.8 μm should have a BPP approximated as λ/π of 1.53 mm*mrad. This suggests that the beam is about 2.3 times diffraction-limited in the transverse direction, and that it may be comprised of a mixture of the fundamental mode, M=1 and θ=0, and the next mode, M=2 and θ=±2.3 degrees. These example results demonstrate that the presence of direct contact with metal at the BA-QCL sidewalls, in this case gold, may provide an effective mechanism to filter high order transverse modes in a BA-QCL device.

Figure 13:
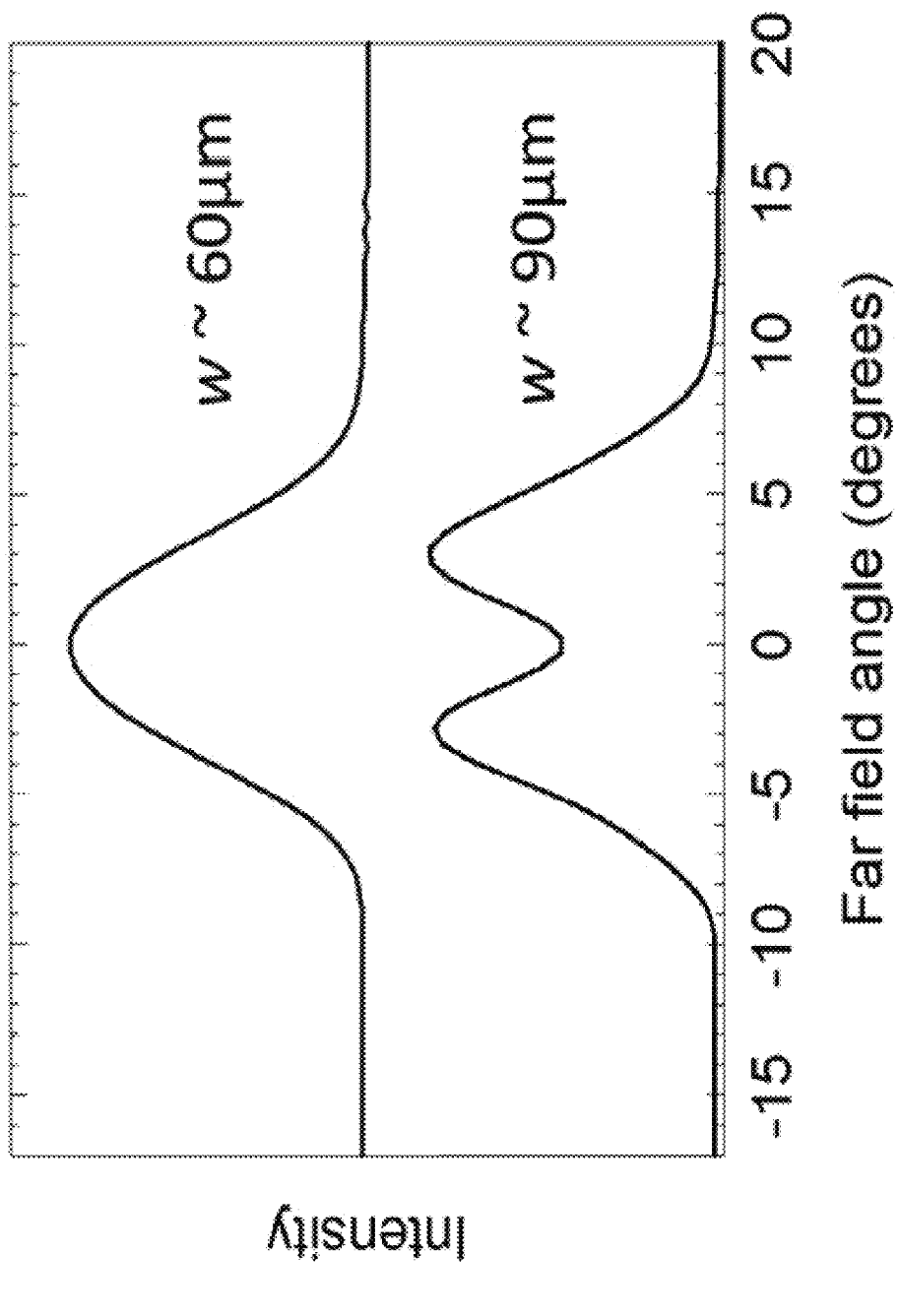
FIG. 13 is a graph showing experimental results, in accordance with a representative embodiment.

FIG. 13 is a graph showing experimental results, in accordance with a representative embodiment. The graph demonstrates another example experiment, where two devices with different cavity widths were compared. Specifically, devices were compared that had cavity widths of w~60 μm and w~90 μm (e.g., after over-etching) that were fabricated as adjacent devices in the same mask and have the same amount of sidewall metal, ~3.5 μm. The measured far field spectra, shown in FIG. 13, indicate that while M=1 and M=2 modes may be operating in the narrower device, the M=3 mode with θ~±3.1 may be operating in the wider device. This result may be consistent with expectations of reduced attenuation of modes in the wider cavity. This may also suggest that the present teachings may be quite robust for mid-infrared BA-QCL cavity widths in this range, allowing for the fine-tuning of parameters such as metal depth and cavity width that can be controlled.

Figure 14:
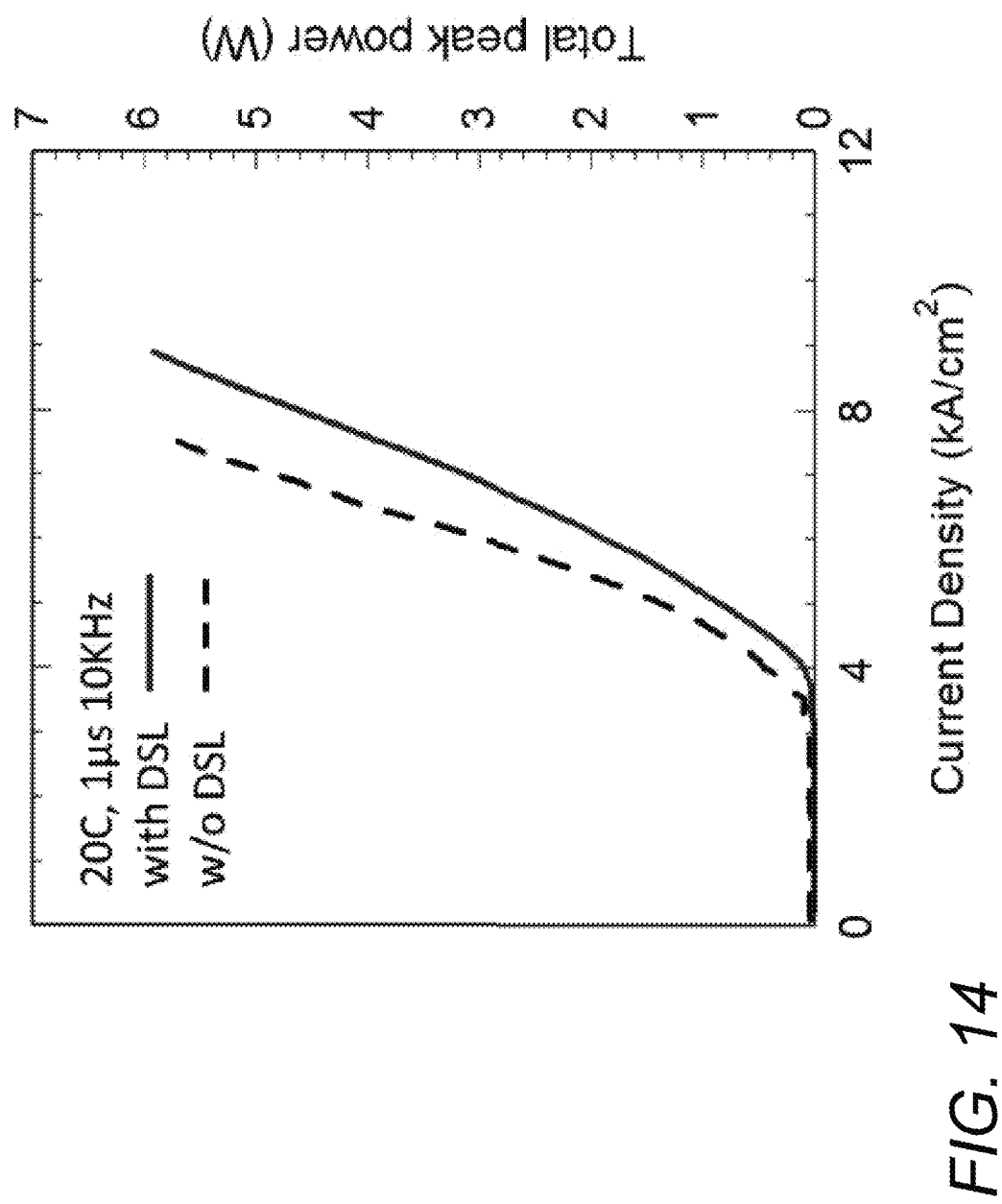
FIG. 14 is a graph showing experimental results, in accordance with a representative embodiment.

FIG. 14 is a graph showing experimental results, in accordance with a representative embodiment. Specifically, the figure shows example experimental results, with a device having distributed sidewall loss (labeled "DSL" in the figure) techniques as described herein shown as solid, and without distributed sidewall loss techniques shown as dashed.

A consideration of the devices, systems, and methods discussed herein may include whether the extraction of the fundamental mode in a BA-QCL, using the distributed sidewall loss techniques, will result in a significant penalty in the power generated by the device. To assess this, discussed herein is an example experiment where the effective width of the device (after distributed sidewall loss techniques are applied) and extracted power as a function of the current density for the device shown in the third image 1103 of FIG. 1I is compared to that from the device shown in the first image 1101 of FIG. 11. The results are shown in FIG. 14 and indicate that a slightly higher (about 10%) threshold current density and slightly lower slope efficiency may be evident.

A qualitative explanation of the observed trends can be made by considering models of thick metal-clad waveguides, where complex refractive indices are used in the Maxwell equation to account for the loss in the metal clad. It is generally computed that for higher order modes, a larger fraction of time-average power resides in the metallic cladding, leading to a larger attenuation constant. These model results may be extended to the specific geometry of the BA-QCLs discussed herein. The aforementioned results demonstrate that because the fundamental transverse mode is nearly competitive with high order transverse modes in a BA-QCL, extracting the fundamental mode to operate alone may not be impractical or difficult using the present teachings. These results may thus be easily reproduced for QCLs with a variety of wavelengths, cavity widths, and top clad layer thicknesses. These results may also be relatively consistent with a report of mode suppression, attributed to the presence of metal regions near the edges of the cavity in metal-metal terahertz QCLs.

Thus, as discussed herein, a distributed sidewall loss (DSL) technique is demonstrated, whereby a modification of the standard fabrication procedure in QCLs may be used to form a direct contact between the top portion of the sidewall of the device and a lossy material. As a result of the preferential attenuation of the high order transverse modes, the fundamental transverse mode may be extracted in BA-QCL devices, with only a slight degradation of device characteristics. The resulting single lobed emission with desirous beam quality may lead to enhanced brightness in broad area devices in which power is scaled.

In other words, brightness from a broad area quantum cascade laser may be compromised by the presence of high order transverse modes that are favored in place of the fundamental transverse mode. In this disclosure, a distributive loss method is described where the proximity of lossy material at or near the sidewalls of the laser optical cavity can provide preferential losses to the unwanted high order transverse modes. Results may include the suppression of these high order transverse modes, and subsequent recovery of fundamental or near-fundamental mode operation in broad area quantum cascade lasers, when it would not otherwise be possible.

The above systems, devices, methods, processes, and the like may be realized in hardware, software, or any combination of these suitable for a particular application. The hardware may include a general-purpose computer and/or dedicated computing device. This includes realization in one or more microprocessors, microcontrollers, embedded microcontrollers, programmable digital signal processors or other programmable devices or processing circuitry, along with internal and/or external memory. This may also, or instead, include one or more application specific integrated circuits, programmable gate arrays, programmable array logic components, or any other device or devices that may be configured to process electronic signals. It will further be appreciated that a realization of the processes or devices described above may include computer-executable code created using a structured programming language such as C, an object oriented programming language such as C++, or any other high-level or low-level programming language (including assembly languages, hardware description languages, and database programming languages and technologies) that may be stored, compiled, or executed to run on one of the above devices, as well as heterogeneous combinations of processors, processor architectures, or combinations of different hardware and software. In another implementation, the methods may be embodied in systems that perform the steps thereof, and may be distributed across devices in a number of ways. At the same time, processing may be distributed across devices such as the various systems described above, or all of the functionality may be integrated into a dedicated, standalone device or other hardware. In another implementation, means for performing the steps associated with the processes described above may include any of the hardware and/or software described above. All such permutations and combinations are intended to fall within the scope of the present disclosure.

Embodiments disclosed herein may include computer program products comprising computer-executable code or computer-usable code that, when executing on one or more computing devices, performs any and/or all of the steps thereof. The code may be stored in a non-transitory fashion in a computer memory, which may be a memory from which the program executes (such as random-access memory associated with a processor), or a storage device such as a disk drive, flash memory or any other optical, electromagnetic, magnetic, infrared or other device or combination of devices. In another implementation, any of the systems and methods described above may be embodied in any suitable transmission or propagation medium carrying computer-executable code and/or any inputs or outputs from same.

It will be appreciated that the devices, systems, and methods described above are set forth by way of example and not of limitation. Absent an explicit indication to the contrary, the disclosed steps may be modified, supplemented, omitted, and/or re-ordered without departing from the scope of this disclosure. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context.

The method steps of the implementations described herein are intended to include any suitable method of causing such method steps to be performed, consistent with the patentability of the following claims, unless a different meaning is expressly provided or otherwise clear from the context. So, for example performing the step of X includes any suitable method for causing another party such as a remote user, a remote processing resource (e.g., a server or cloud computer) or a machine to perform the step of X. Similarly, performing steps X, Y, and Z may include any method of directing or controlling any combination of such other individuals or resources to perform steps X, Y, and Z to obtain the benefit of such steps. Thus, method steps of the implementations described herein are intended to include any suitable method of causing one or more other parties or entities to perform the steps, consistent with the patentability of the following claims, unless a different meaning is expressly provided or otherwise clear from the context. Such parties or entities need not be under the direction or control of any other party or entity, and need not be located within a particular jurisdiction.

It should further be appreciated that the methods above are provided by way of example. Absent an explicit indication to the contrary, the disclosed steps may be modified, supplemented, omitted, and/or re-ordered without departing from the scope of this disclosure.

It will be appreciated that the methods and systems described above are set forth by way of example and not of limitation. Numerous variations, additions, omissions, and other modifications will be apparent to one of ordinary skill in the art. In addition, the order or presentation of method steps in the description and drawings above is not intended to require this order of performing the recited steps unless a particular order is expressly required or otherwise clear from the context. Thus, while particular embodiments have been shown and described, it will be apparent to those skilled in the art that various changes and modifications in form and details may be made therein without departing from the scope of this disclosure and are intended to form a part of the disclosure as defined by the following claims, which are to be interpreted in the broadest sense allowable by law.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A broad area quantum cascade laser, comprising:
   an optical cavity defined by a top and two sidewalls;
   the optical cavity including an active region for producing photons when an electric current is applied thereto, and being subject to a presence of at least one high order transverse optical mode when producing photons;
   a layer of an optically low-loss material being in contact with each of the two sidewalls and also the active region;
   a first layer of an optically lossy material being in contact with a first portion of each of the two sidewalls; and
   the first portion extending from the top to a location short of adjacency to the active region.

2. The broad area quantum cascade laser of claim 1, where the first portion is sized to select a fundamental optical transverse mode by causing loss to the at least one high order transverse optical mode.

3. The broad area quantum cascade laser of claim 1, where the optically lossy material comprises a metal.

4. The broad area quantum cascade laser of claim 3, where the metal comprises gold.

5. The broad area quantum cascade laser of claim 2, where the first portion is sized to avoid causing an electrical short in the broad area quantum cascade laser.

6. The broad area quantum cascade laser of claim 1, where the optically lossy material is placed in contact with the two sidewalls using a photolithographic process.

7. The broad area quantum cascade laser of claim 1, where the optical cavity has a cavity length and the first portion extends for the cavity length, such that losses to the at least one high order transverse optical mode are distributed along the cavity length.

8. The broad area quantum cascade laser of claim 1, where:
the first portion extends along a first length of the optical cavity; and
the optical cavity has a cavity length greater than the first length, such that losses to the at least one high order transverse optical mode are distributed along only a portion of the cavity length.

9. The broad area quantum cascade laser of claim 1, where the optically lossy material and the optically low-loss material are positioned along the two sidewalls to cause at least a near fundamental transverse mode to operate, thereby producing a laser beam with a single lobe aligned with an optical axis of the optical cavity during operation of the broad area quantum cascade laser.

10. The broad area quantum cascade laser of claim 1, where the optically low-loss material is comprised of a dielectric material.

11. The broad area quantum cascade laser of claim 10, where the dielectric material is selected from a group consisting of silicon dioxide and silicon nitride.

12. The broad area quantum cascade laser of claim 1, further comprising a second layer of the optically lossy material being in contact with the top of the optical cavity.

13. The broad area quantum cascade laser of claim 12, where the first and second layers of the optically lossy material are contiguous.

14. A broad area quantum cascade laser, comprising: an optical cavity defined by a top and two sidewalls; the optical cavity including an active region for producing photons when an electric current is applied thereto, and being subject to a presence of at least one high order transverse optical mode when producing photons; a layer of an optically low-loss material being in contact with each of the two sidewalls and also the active region; a first layer of an optically lossy material being in contact with a first portion of one or more of the two sidewalls; and the first portion not extending so far as to lie adjacent to the active region.

15. The broad area quantum cascade laser of claim 14, further comprising a second layer of the optically lossy material being in contact with the top of the optical cavity.

16. The broad area quantum cascade laser of claim 15, where the first and second layers of the optically lossy material are contiguous.

17. The broad area quantum cascade laser of claim 15, where the optically low-loss material is comprised of a dielectric material.

18. The broad area quantum cascade laser of claim 15, where the first portion is sized to select a fundamental optical transverse mode by causing loss to the at least one high order transverse optical mode.

19. The broad area quantum cascade laser of claim 15, where: the first portion extends along a first length of the optical cavity; and the optical cavity has a cavity length greater than the first length, such that losses to the at least one high order transverse optical mode are distributed along only a portion of the cavity length.

\* \* \* \* \*